(12) United States Patent
Camacho et al.

(10) Patent No.: US 9,337,161 B2
(45) Date of Patent: May 10, 2016

(54) INTEGRATED CIRCUIT PACKAGE SYSTEM WITH REMOVABLE BACKING ELEMENT HAVING PLATED TERMINAL LEADS AND METHOD OF MANUFACTURE THEREOF

(71) Applicant: STATS ChipPAC, Ltd., Singapore (SG)

(72) Inventors: Zigmund R. Camacho, Singapore (SG); Dioscoro A. Merilo, Singapore (SG); Henry Descalzo Bathan, Singapore (SG); Lionel Chien Hui Tay, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 14/340,436

(22) Filed: Jul. 24, 2014

(65) Prior Publication Data

US 2014/0332955 A1    Nov. 13, 2014

Related U.S. Application Data

(63) Continuation of application No. 13/536,321, filed on Jun. 28, 2012, now Pat. No. 8,810,017, which is a continuation of application No. 12/635,695, filed on Dec. 10, 2009, now Pat. No. 8,212,342.

(51) Int. Cl.
*H01L 23/495* (2006.01)
*H01L 23/00* (2006.01)
(Continued)

(52) U.S. Cl.
CPC ............. *H01L 24/11* (2013.01); *H01L 21/568* (2013.01); *H01L 23/28* (2013.01); *H01L 23/3107* (2013.01); *H01L 23/3128* (2013.01); *H01L 24/14* (2013.01); *H01L 24/17* (2013.01); *H01L 24/29* (2013.01); *H01L 24/49* (2013.01); *H01L 24/73* (2013.01); *H01L 24/81* (2013.01); *H01L 24/85* (2013.01); *H01L 24/92* (2013.01); *H01L 24/97* (2013.01); *H01L 25/0657* (2013.01); *H01L 25/105* (2013.01); *H01L 21/6835* (2013.01); *H01L 24/13* (2013.01); *H01L 24/16* (2013.01); *H01L 24/32* (2013.01); *H01L 24/45* (2013.01); *H01L 24/48* (2013.01); *H01L 2221/68372* (2013.01); *H01L 2224/16145* (2013.01); *H01L 2224/2919* (2013.01); *H01L 2224/29111* (2013.01); *H01L 2224/32245* (2013.01); *H01L 2224/45124* (2013.01);
(Continued)

(58) Field of Classification Search
CPC ... H01L 24/11; H01L 21/568; H01L 21/6835; H01L 23/4012; H01L 23/49861; H01L 25/117; H01L 2221/68372
USPC .......... 438/107, 109, 123, 124; 257/676, 777, 257/690, 723, E23.034, E21.506, E21.516
See application file for complete search history.

(56) References Cited

U.S. PATENT DOCUMENTS

| 5,331,205 A | 7/1994 | Primeaux |
| 6,683,385 B2 | 1/2004 | Tsai et al. |

(Continued)

*Primary Examiner* — Tu-Tu Ho
(74) *Attorney, Agent, or Firm* — Robert D. Atkins; Atkins and Associates, P.C.

(57) ABSTRACT

A method of manufacture of an integrated circuit package system includes: attaching a first die to a first die pad; connecting electrically a second die to the first die through a die interconnect positioned between the first die and the second die; connecting a first lead adjacent the first die pad to the first die; connecting a second lead to the second die, the second lead opposing the first lead and adjacent the second die; and providing a molding material around the first die, the second die, the die interconnect, the first lead and the second lead, with a portion of the first lead exposed.

21 Claims, 18 Drawing Sheets

(51) Int. Cl.
*H01L 21/56* (2006.01)
*H01L 23/31* (2006.01)
*H01L 25/065* (2006.01)
*H01L 25/10* (2006.01)
*H01L 23/28* (2006.01)
*H01L 21/683* (2006.01)

(52) U.S. Cl.
CPC .............. *H01L2224/45144* (2013.01); *H01L 2224/4899* (2013.01); *H01L 2224/48227* (2013.01); *H01L 2224/48229* (2013.01); *H01L 2224/48247* (2013.01); *H01L 2224/49* (2013.01); *H01L 2224/731* (2013.01); *H01L 2224/732* (2013.01); *H01L 2224/73253* (2013.01); *H01L 2224/73265* (2013.01); *H01L 2224/8101* (2013.01); *H01L 2224/81194* (2013.01); *H01L 2224/81801* (2013.01); *H01L 2224/81986* (2013.01); *H01L 2224/8592* (2013.01); *H01L 2224/85203* (2013.01); *H01L 2224/85205* (2013.01); *H01L 2224/85951* (2013.01); *H01L 2224/92* (2013.01); *H01L 2224/92247* (2013.01); *H01L 2224/97* (2013.01); *H01L 2225/0651* (2013.01); *H01L 2225/06513* (2013.01); *H01L 2225/06582* (2013.01); *H01L 2225/1023* (2013.01); *H01L 2225/1029* (2013.01); *H01L 2924/0103* (2013.01); *H01L 2924/014* (2013.01); *H01L 2924/01005* (2013.01); *H01L 2924/01013* (2013.01); *H01L 2924/01029* (2013.01); *H01L 2924/0132* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/01087* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15747* (2013.01); *H01L 2924/181* (2013.01); *H01L 2924/19041* (2013.01); *H01L 2924/37* (2013.01); *H01L 2924/37001* (2013.01)

(56) References Cited

U.S. PATENT DOCUMENTS

| | | |
|---|---|---|
| 6,815,254 B2 | 11/2004 | Mistry et al. |
| 7,009,297 B1 | 3/2006 | Chiang et al. |
| 7,190,080 B1 | 3/2007 | Leu et al. |
| 7,355,274 B2 | 4/2008 | Lim |
| 7,378,300 B2 | 5/2008 | Marimuthu et al. |
| 7,385,299 B2 | 6/2008 | Chow et al. |
| 7,888,181 B2 | 2/2011 | Camacho et al. |
| 7,932,161 B2 | 4/2011 | Apanius et al. |
| 7,986,043 B2 | 7/2011 | Merilo et al. |
| 2002/0192855 A1 | 12/2002 | Nagoa |
| 2003/0197282 A1 | 10/2003 | Tsai et al. |
| 2003/0228720 A1 | 12/2003 | Ito et al. |
| 2004/0130010 A1 | 7/2004 | Kuan et al. |
| 2005/0012195 A1* | 1/2005 | Go ............... H01L 23/3128 257/686 |
| 2006/0125070 A1* | 6/2006 | Lim ........................ 257/686 |
| 2007/0096265 A1 | 5/2007 | Wallace |
| 2007/0210443 A1 | 9/2007 | Merilo et al. |
| 2007/0215992 A1* | 9/2007 | Shen ............... H01L 21/6836 257/668 |
| 2007/0232026 A1 | 10/2007 | Apanius et al. |
| 2007/0284715 A1 | 12/2007 | Li et al. |
| 2008/0029867 A1* | 2/2008 | Kim et al. ................ 257/686 |
| 2008/0029903 A1* | 2/2008 | Lin ............... H01L 23/3121 257/777 |
| 2009/0026632 A1* | 1/2009 | Shen et al. ............... 257/777 |
| 2009/0215230 A1 | 8/2009 | Muto et al. |
| 2010/0270667 A1* | 10/2010 | Tong et al. .............. 257/682 |
| 2010/0270688 A1* | 10/2010 | Su et al. ................ 257/777 |

* cited by examiner

US 9,337,161 B2

INTEGRATED CIRCUIT PACKAGE SYSTEM WITH REMOVABLE BACKING ELEMENT HAVING PLATED TERMINAL LEADS AND METHOD OF MANUFACTURE THEREOF

CLAIM OF DOMESTIC PRIORITY

The present invention is a continuation of U.S. patent application Ser. No. 13/536,321, now U.S. Pat. No. 8,810, 017, filed Jun. 28, 2012, which is a continuation of U.S. patent application Ser. No. 12/635,695, now U.S. Pat. No. 8,212, 342, filed Dec. 10, 2009, which applications are incorporated herein by reference.

FIELD OF THE INVENTION

The present invention relates generally to an integrated circuit package systems, and more particularly to a system for manufacturing a stackable integrated circuit package.

BACKGROUND OF THE INVENTION

Semiconductor devices are ubiquitous in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, can be produced more efficiently, and have higher performance. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Often, when forming integrated circuit packages, it is necessary to form top and bottom interconnection structures in the packages. The top and bottom interconnect structure facilitates the mounting of the packages to motherboards, and other printed circuit boards (PCBs) or substrates. Furthermore, by forming the interconnections on top and bottom surfaces of the package, multiple packages can be placed over one-another to form stacked packages that provide sophisticated functionality in a small volume. The top and bottom interconnects usually include conductive through-hole vias (THVs) formed within a perimeter of the package. Conductive THVs are difficult to manufacture and require several additional fabrication steps that increase the cost and manufacturing time of the package. Furthermore, as fabrication technologies improve, average die size shrinks and the number of input/output pins per die increases. Due to the increasing pin density, it is difficult to mount the resulting die to conventional motherboards which are configured for ball grid array (BGA) mounting technologies using larger input/output bumps with a larger pitch.

Thus, a need still remains for a lower cost way of providing top and bottom terminals for package stacking and device integration. It is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY OF THE INVENTION

In one embodiment, the present invention is a method of making of a semiconductor device comprising the steps of providing a first substrate, disposing a first semiconductor die over a first surface of the first substrate with the first substrate extending beyond the first semiconductor die and an active surface of the first semiconductor die oriented away from the first substrate, forming a first bond wire between the first substrate and a first contact pad on the first semiconductor die, forming a bump over a second contact pad on the first semiconductor die, and depositing an encapsulant over the first semiconductor die, first bond wire, and first substrate.

In another embodiment, the present invention is a method of making of a semiconductor device comprising the steps of providing a first substrate, disposing a first semiconductor die over a surface of the first substrate, forming a first interconnect structure extending from the surface of the first substrate, forming a second interconnect structure over a first contact pad on the first semiconductor die, and depositing an encapsulant over the first semiconductor die, first interconnect structure, and first substrate.

In another embodiment, the present invention is a semiconductor device comprising a first substrate and first semiconductor die disposed over the first substrate. A first interconnect structure is formed between the first substrate and a first contact pad on the first semiconductor die. A second interconnect structure is formed over a second contact pad on the first semiconductor die. An encapsulant is deposited over the first semiconductor die, first interconnect structure, and first substrate.

In another embodiment, the present invention is a semiconductor device comprising a first substrate and first semiconductor die disposed over a surface of the first substrate. A first interconnect structure extends from the surface of the first substrate. An encapsulant is deposited over the first semiconductor die, first interconnect structure, and first substrate.

Certain embodiments of the invention have other steps or elements in addition to or in place of those mentioned above. The steps or element will become apparent to those skilled in the art from a reading of the following detailed description when taken with reference to the accompanying drawings.

DETAILED DESCRIPTION OF THE DRAWINGS

Figure 1:
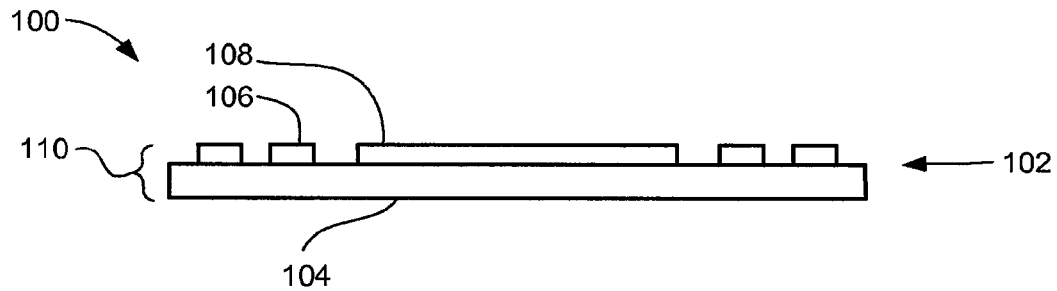
FIG. 1 is a cross-sectional view of an embodiment of an integrated circuit package system of the present invention in an intermediate stage of manufacture.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation. Where multiple embodiments are disclosed and described having some features in common, for clarity and ease of illustration, description, and comprehension thereof, similar and like features one to another will ordinarily be described with similar reference numerals. For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an embodiment of an integrated circuit package system 100 of the present invention in an intermediate stage of manufacture. The integrated circuit package system 100 includes a first substrate 102. The first substrate 102 includes a first removable backing element 104 with a first plurality of terminal leads 106 and a first die attach pad 108 to form a first frame 110.

As shown in FIG. 1, the first frame 110 is manufactured from a first removable backing element 104 from a material that can be etched or otherwise removed from the first plurality of terminal leads 106 and the first die attach pad 108. Accordingly the first removable backing element 104 can be manufactured from a metal, such as copper, such as by stamping, or otherwise forming the first removable backing element 104. The first plurality of terminal leads 106 and the first die attach pad 108 are plated, or otherwise positioned and formed onto the first removable backing element 104.

The first frame 110 typically is formed as a strip (not shown) of the first frames 110 to enable assembly of several integrated circuit package systems 100 at the same time.

Figure 2:
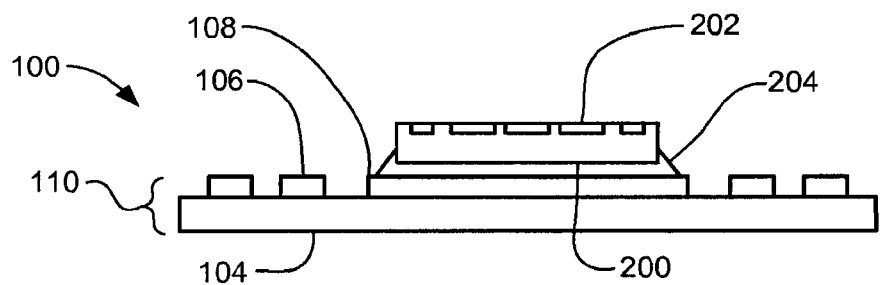
FIG. 2 is a cross-sectional view of a first frame shown in FIG. 1 after die attach of a first die.

Referring now to FIG. 2, therein is shown a cross-sectional view of a first frame 110 shown in FIG. 1 after die attach of a first die 200. The first die 200 includes an active area containing analog or digital circuits implemented as active devices, passive devices, conductive layers, and dielectric layers formed within the first die 200 and are electrically interconnected according to the electrical design of the first die 200. For example, the circuit may include one or more transistors, diodes, inductors, capacitors, resistors, and other circuit elements formed within the active area of the first die 200. The first plurality of contact pads 202 are made with a conductive material, such as aluminum (Al), copper (Cu), tin (Sn), nickel (Ni), gold (Au), or silver (Ag), and are electrically connected to the circuit elements formed within the first die 200. The first plurality of contact pads 202 is formed by PVD, CVD, electrolytic plating, or an electroless plating process. The first die 200 is attached to the first die attach pad 108 using a first die attach adhesive 204, which may be any suitable adhesive material used for die attachment, such as an epoxy, silver filled glass, solder, a thermal epoxy, a laminated polymer adhesive or an ultra-violet (UV) curable liquid adhesive, for example.

Figure 3:
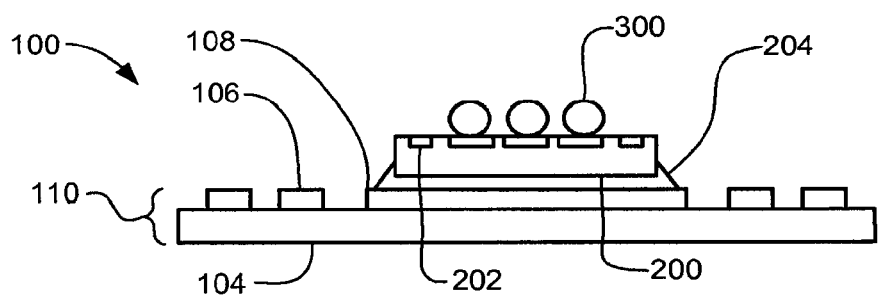
FIG. 3 is a cross-sectional view of the first frame shown in FIG. 2 after a die interconnect stage of manufacture.

Referring now to FIG. 3, therein is shown a cross-sectional view of the first frame 110 shown in FIG. 2 after a die interconnect stage of manufacture. A plurality of die interconnects 300, such as a plurality of solder bumps, is attached to the first plurality of contact pads 202 on the first die 200 using readily available die interconnect forming processes, such as solder bump forming processes, that are available in the semiconductor manufacturing industry. The plurality of die interconnects 300 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free solder. A solder material is deposited over selected ones of the first plurality of contact pads 202 using a ball drop or stencil printing process, for example. The solder material includes an electrically conductive material such as Sn, Pb, Au, Ag, Cu, Zn, Bi, and alloys thereof, with an optional flux material. For example, the solder material can be eutectic Sn/Pb, high lead, or lead free. The solder (or other conductive material) is reflowed to form the plurality of die interconnects 300.

Figure 4:
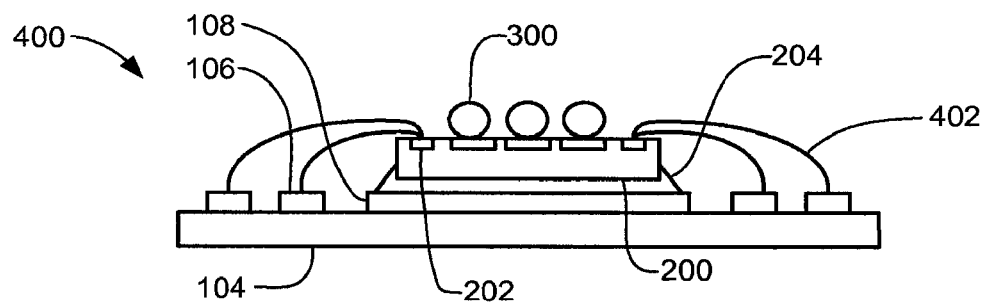
FIG. 4 is a cross-sectional view of the first frame shown in FIG. 3 after wirebonding the first die to a first plurality of terminal leads on the first frame.

Referring now to FIG. 4, therein is shown a cross-sectional view of the first frame 110 shown in FIG. 3 after wirebonding the first die 200 to a first plurality of terminal leads 106 on the first frame 110. The first plurality of contact pads 202 on the first die 200 is electrically connected to the first plurality of terminal leads 106 by a plurality of bond wires 402. The first plurality of bond wires 402 is a plurality of fine, conductive wires, typically gold (Au) or aluminum (Al). Wire bonding is typically done with automated wire bonding equipment employing well-known thermal-compression or ultrasonic wire bonding techniques.

Figure 5:
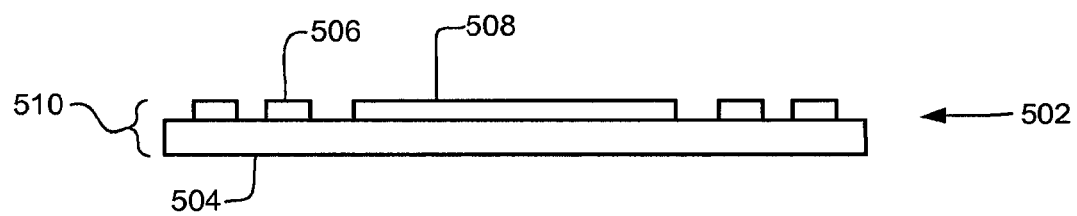
FIG. 5 is a cross-sectional view of a second substrate.

Referring now to FIG. 5 therein is shown a cross-sectional view of a second substrate 502. The second substrate 502 includes a second removable backing element 504 with a second plurality of terminal leads 506 and a second die attach pad 508 to form a second frame 510.

As shown in FIG. 5, the second frame 510 is manufactured from the second removable backing element 504 from a material that can be etched or otherwise removed from the second plurality of terminal leads 506 and the second die attach pad 508. Accordingly, the second removable backing element 504 can be manufactured from a metal, such as copper, such as by stamping or otherwise forming the second removable backing element 504. The second plurality of terminal leads 506 and the second die attach pad 508 are plated, or otherwise positioned and formed onto the second removable backing element 504.

The second frame 510 typically is formed as a strip (not shown) of the second frames 510 to enable assembly of several integrated circuit package systems 100 at the same time.

Figure 6:
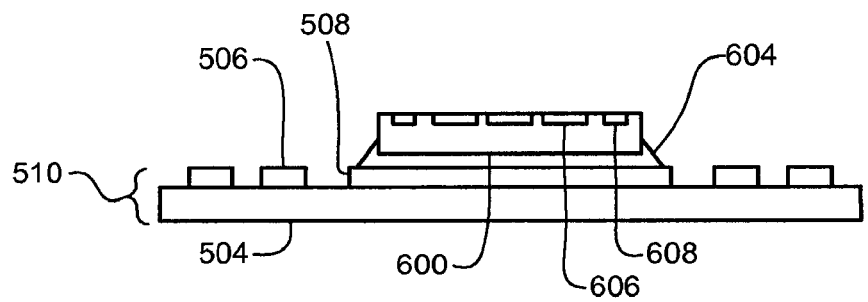
FIG. 6 is a cross-sectional view of a second frame shown in FIG. 5 after die attach of a second die having a second plurality of contact pads.

Referring now to FIG. 6, therein is shown a cross-sectional view of a second frame 510 shown in FIG. 5 after die attach of a second die 600 having a second plurality of contact pads 602. The second die 600 includes an active area containing analog or digital circuits implemented as active devices, passive devices, conductive layers, and dielectric layers formed within the second die 600 and are electrically interconnected according to the electrical design of the second die 600. For example, the circuit may include one or more transistors, diodes, inductors, capacitors, resistors, and other circuit elements formed within the active area of the second die 600. The second plurality of contact pads 602 are made with a conductive material, such as aluminum (Al), copper (Cu), tin (Sn), nickel (Ni), gold (Au), or silver (Ag), and are electrically connected to the circuit elements formed within the second die 600. The second plurality of contact pads 602 is formed by PVD, CVD, electrolytic plating, or an electro-less plating process. The second die 600 is attached to the second die attach pad 508 using a second die attach adhesive 604, which may be any suitable adhesive material used for die attachment, such as an epoxy, silver filled glass, solder, a thermal epoxy, a laminated polymer adhesive or an ultraviolet (UV) curable liquid adhesive, for example.

Figure 7:
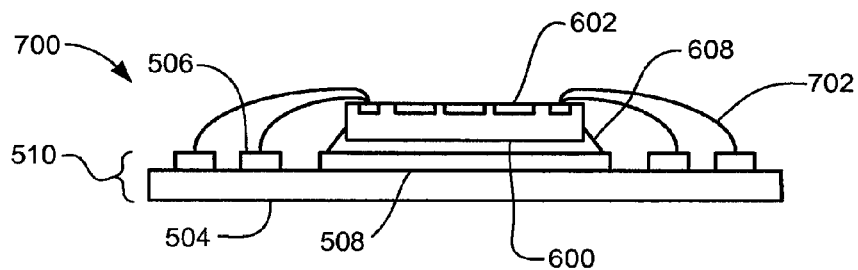
FIG. 7 is a cross-sectional view of the second frame shown in FIG. 6 after wirebonding the second die to a second plurality of terminal leads on the second frame.

Referring now to FIG. 7, therein is shown a cross-sectional view of the second frame 510 shown in FIG. 6 after wirebonding the second die 600 to a second plurality of terminal leads 506 on the second frame 510. The second plurality of contact pads 602 on the second die 600 is electrically connected to the second plurality of terminal leads 506 by a second plurality of bond wires 702. The second plurality of bond wires 702 is a plurality of fine, conductive wires, typically gold (Au) or aluminum (Al). Wire bonding is typically done with automated wire bonding equipment employing well-known thermal-compression or ultrasonic wire bonding techniques.

Figure 8:
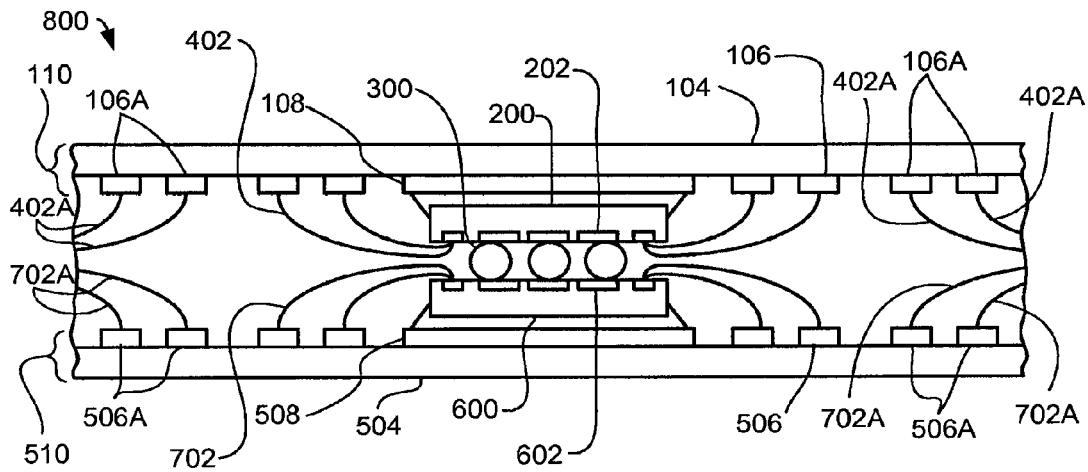
FIG. 8 is a cross-sectional view illustrating the overlaying of the first frame shown in FIG. 4 and the second frame shown in FIG. 7 after reflowing a plurality of die interconnects to form a stacked integrated circuit assembly.

Referring now to FIG. 8, therein is shown a cross-sectional view illustrating the overlaying of the first frame 110 shown in FIG. 4 and the second frame 510 shown in FIG. 7 after reflowing a plurality of die interconnects 300 to form a stacked integrated circuit assembly 800. The first frame 110 is inverted and positioned over the second frame 510 so the plurality of die interconnects 300 is aligned with the second plurality of contact pads 602 on the second die 600. The plurality of die interconnects 300 is brought into contact with the second plurality of contact pads 602, and the plurality of die interconnects 300 is reflowed by heating to form a connection between the first plurality of contact pads 202 on the first die 200 and the second plurality of contact pads 602 on the second die 600 to form the stacked integrated circuit assembly 800.

In FIG. 8, an additional first plurality of terminal leads 106A is shown as formed on the first removable backing element 104, and an additional second plurality of terminal leads 506A is shown formed on the second removable backing element 504 to illustrate that the first frame 110 and the second frame 510 may be formed in strips. An additional first plurality of bond wires 402A would be wirebonded to the additional first plurality of terminal leads 106A and to an additional die (not shown) positioned on either side of the first die 200. Similarly, an additional second plurality of bond wires 702A would be wirebonded to the additional second plurality of terminal leads 506A and to an additional die (not shown) positioned on either side of the second die 600.

Figure 9:
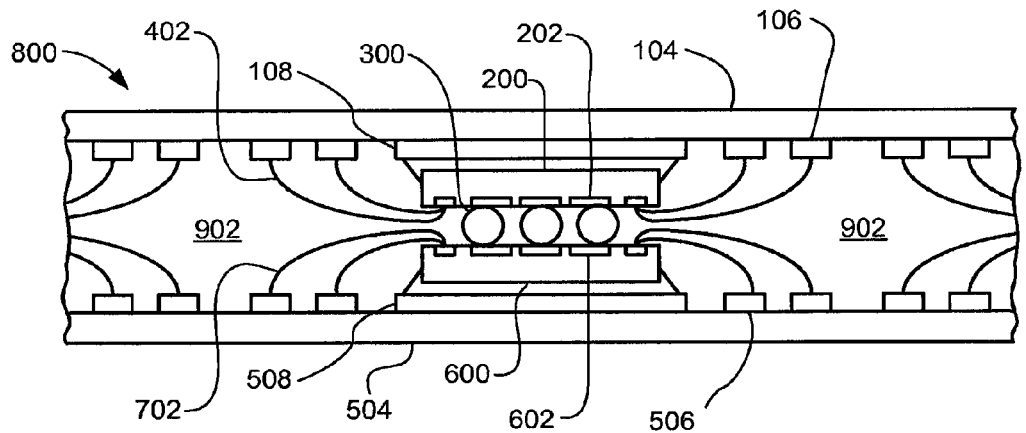
FIG. 9 is a cross-sectional view of the stacked integrated circuit assembly shown in FIG. 8 after a molding process.

Referring now to FIG. 9, therein is shown a cross-sectional view of the stacked integrated circuit assembly 800 shown in FIG. 8 after a molding process. After the reflowing process described above with reference to FIG. 8, the stacked integrated circuit assembly 800 undergoes a molding process. A molding material 902 is formed in the space between the first frame 110 and the second frame 510 to fill the space. The molding material 902 may be any suitable material such as an epoxy, silicone, or polyimide based compound providing protection to the stacked integrated circuit assembly 800.

Figure 10:
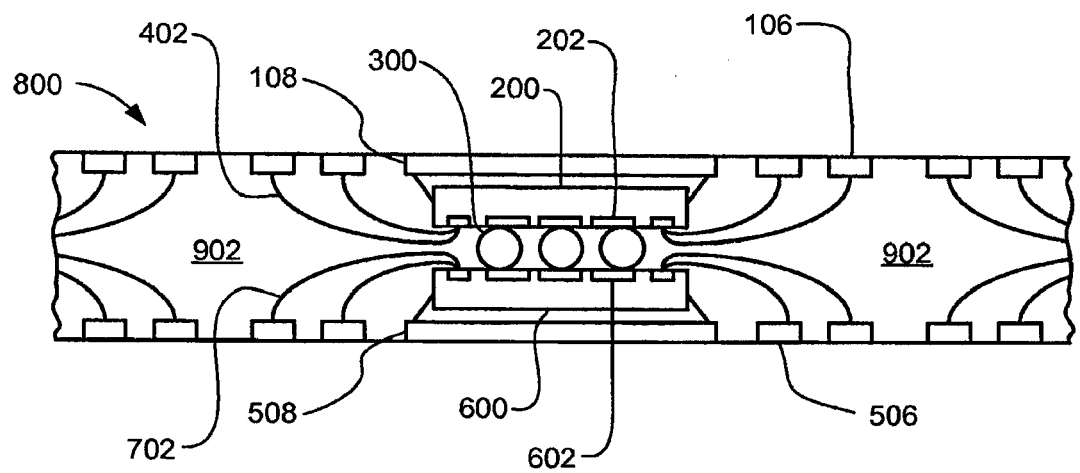
FIG. 10 is a cross-sectional view of the stacked integrated circuit assembly shown in FIG. 9 after removing a first removable backing element and a second removable backing element.

Referring now to FIG. 10, therein is shown a cross-sectional view of the stacked integrated circuit assembly 800 shown in FIG. 9 after removing a first removable backing element 104 and a second removable backing element 504. The first removable backing element 104 and the second removable backing element 504 are collectively referred to herein as the removable backing elements. The method of removing the removable backing elements depends upon the material used to form the removable backing elements. For example, if the removable backing elements are formed of a metal, such as copper, as described above, the removable backing elements may be removed by selectively etching the removable backing elements with a suitable etchant. After removing the removable backing elements the undersides of the first plurality of terminal leads 106, the first die attach pad 108, the second plurality of terminal leads 506, and the second die attach pad 508 are exposed for possible connection to other packages or a to printed circuit board (PCB).

Figure 11:
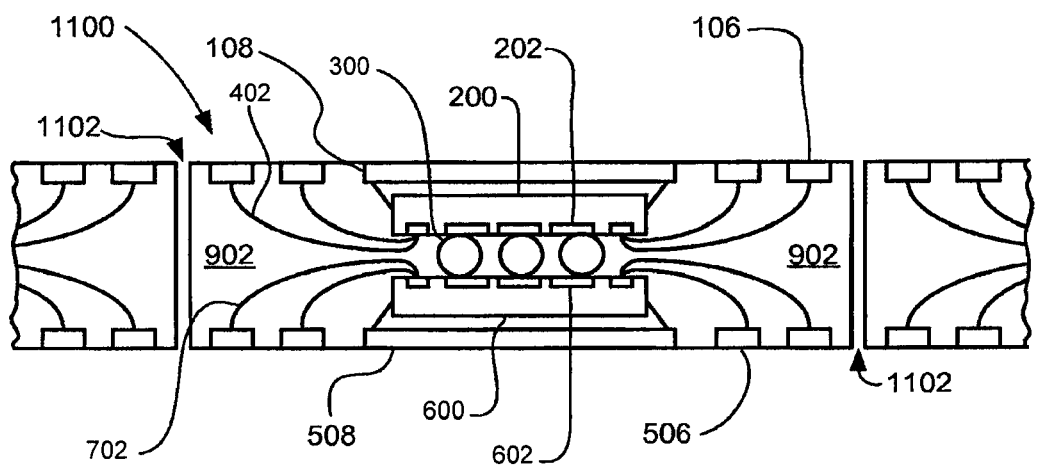
FIG. 11 is a cross-sectional view of the stacked integrated circuit assembly shown in FIG. 10 after a singulation process.

Referring now to FIG. 11, therein is shown a cross-sectional view of the stacked integrated circuit assembly 800 shown in FIG. 10 after a singulation process. After the removable backing elements are removed, a package singulation process is performed to obtain a stacked integrated circuit package system 1100. Any suitable singulation process may be used, such as sawing or laser cutting to cut through the molding material 902 to form a space 1102 to define a stacked integrated circuit system 1100.

Figure 12:
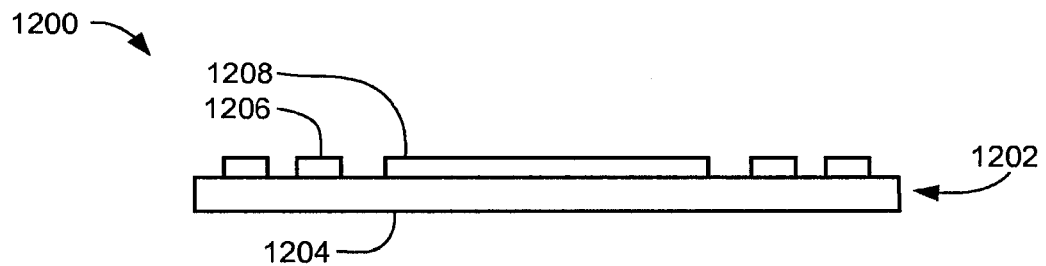
FIG. 12 is a cross-sectional view of an integrated circuit package system of the present invention at an intermediate stage of manufacture in accordance with an embodiment of the present invention.

Referring now to FIG. 12, therein is shown a cross-sectional view of an embodiment of an integrated circuit package system 1200 of the present invention at an intermediate stage of manufacture in accordance with an embodiment of the present invention. The integrated circuit package system 1200 includes a first substrate 1202. The first substrate 1202 includes a first removable backing element 1204 with a first plurality of terminal leads 1206 and a first die attach pad 1208 to form a first frame 1210.

As shown in FIG. 12, the first frame 1210 is manufactured from a first removable backing element 1204 from a material that can be etched or otherwise removed from the first plurality of terminal leads 1206 and the first die attach pad 1208. Accordingly the first removable backing element 1204 can be manufactured from a metal, such as copper, such as by stamping, or otherwise forming the first removable backing element 1204. The first plurality of terminal leads 1206 and the first die attach pad 1208 are plated, or otherwise positioned and formed onto the first removable backing element 1204.

The first frame 1210 typically is formed as a strip (not shown) of the first frames 1210 to enable assembly of several integrated circuit package systems 1200 at the same time.

Figure 13:
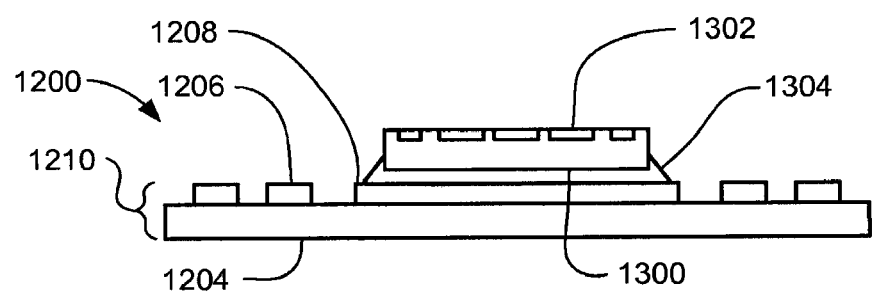
FIG. 13 is a cross-sectional view of a first frame shown in FIG. 12 after die attach of a first die.
Figure 14:
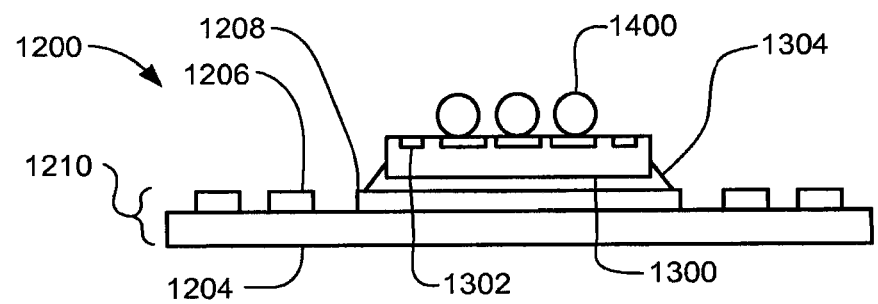
FIG. 14 is a cross-sectional view of the first frame shown in FIG. 13 after a die interconnect stage of manufacture.

Referring now to FIG. 13, therein is shown a cross-sectional view of a first frame 1210 shown in FIG. 12 after die attach of a first die 1300. The first die 1300 includes an active area containing analog or digital circuits implemented as active devices, passive devices, conductive layers, and dielectric layers formed within the first die 1300 and are electrically interconnected according to the electrical design of the first die 1300. For example, the circuit may include one or more transistors, diodes, inductors, capacitors, resistors, and other circuit elements formed within the active area of the first die 1300. The first plurality of contact pads 1302 are made with a conductive material, such as aluminum (Al), copper (Cu), tin (Sn), nickel (Ni), gold (Au), or silver (Ag), and are electrically connected to the circuit elements formed within the first die 1300. The first plurality of contact pads 1302 is formed by PVD, CVD, electrolytic plating, or an electroless plating process. The first die 1300 is attached to the first die attach pad 1208 using a first die attach adhesive 1304, which may be any suitable adhesive material used for die attachment, such as an epoxy, silver filled glass, solder, a thermal epoxy, a laminated polymer adhesive or an ultra-violet (UV) curable liquid adhesive, for example. Referring now to FIG. 14, therein is shown a cross-sectional view of the first frame 1210 shown in FIG. 13 after a die interconnect stage of manufacture. A plurality of die interconnects 1400, such as a plurality of solder bumps, is attached to the first plurality of contact pads 1302 on the first die 1300 using readily available die interconnect forming processes, such as solder bump forming processes, that are available in the semiconductor manufacturing industry. The plurality of die interconnects 1400 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free solder. A solder material is deposited over selected ones of the first plurality of contact pads 1302 using a ball drop or stencil printing process, for example. The solder material includes an electrically conductive material such as Sn, Pb, Au, Ag, Cu, Zn, Bi, and alloys thereof, with an optional flux material. For example, the solder material can be eutectic Sn/Pb, high lead, or lead free. The solder (or other conductive material) is reflowed to form the plurality of die interconnects 1400.

Figure 15:
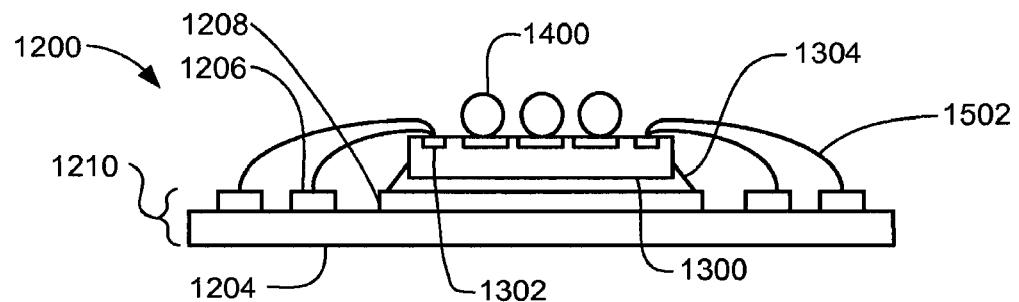
FIG. 15 is a cross-sectional view of the first frame shown in FIG. 14 after wirebonding the first die to a first plurality of terminal pads on the first frame.

Referring now to FIG. 15, therein is shown a cross-sectional view of the first frame 1210 shown in FIG. 14 after wirebonding the first die 1300 to a first plurality of terminal leads 1206 on the first frame 1210. The first plurality of contact pads 1302 on the first die 1300 is electrically connected to the first plurality of terminal leads 1206 by a first plurality of bond wires 1502. The first plurality of bond wires 1502 is a plurality of fine, conductive wires, typically gold (Au) or aluminum (Al). Wire bonding is typically done with automated wire bonding equipment employing well-known thermal-compression or ultrasonic wire bonding techniques.

Figure 16:
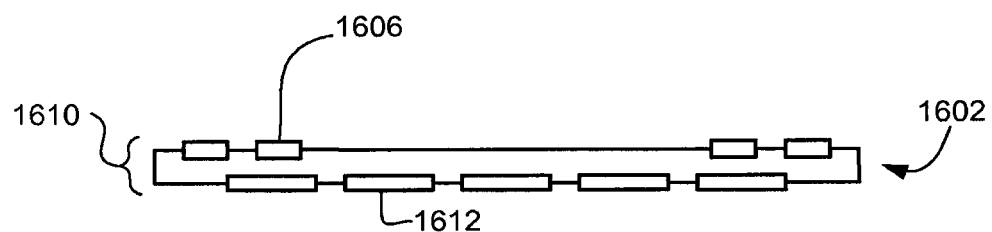
FIG. 16 is a cross-sectional view of a second substrate.

Referring now to FIG. 16, therein is shown a cross-sectional view of a second substrate 1602. The second substrate 1602 is formed of a suitable laminate material to form a laminate substrate 1610. A variety of suitable materials are available for use as the laminate substrate 1610 such as BT resin substrates or any other type of printed wiring boards, etched wiring board, or laminate, made for example, of one or more layers of ceramic, paper impregnated with phenolic resin such as FR-2, woven fiberglass mat impregnated with a flame retardant epoxy resin such as FR-4, plastic with low dielectric constant such as Teflon, polyimide, polystyrene and cross-linked polystyrene.

The laminate substrate 1610 includes a plurality of bonding pads 1606 formed on the upper surface of the laminate substrate 1610. The laminate substrate 1610 also has a plurality of ball pads 1612 formed in the lower surface of the laminate substrate 1610. The plurality of bonding pads 1606 and the plurality of ball pads 1612 are formed using conventional processing techniques.

The laminate substrate 1610 typically is formed as a strip (not shown) of the laminate substrates 1610 to enable assembly of several integrated circuit package systems 1200 at the same time.

Figure 17:
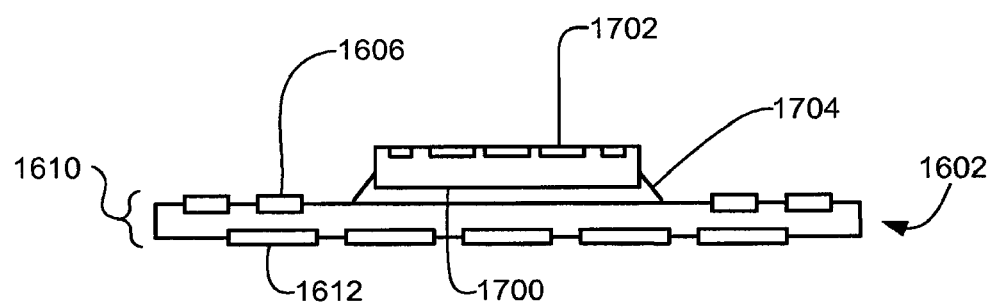
FIG. 17 is a cross-sectional view of a laminate substrate shown in FIG. 16 after die attach of a second die having a second plurality of contact pads.

Referring now to FIG. 17, therein is shown a cross-sectional view of a laminate substrate 1610 shown in FIG. 16 after die attach of a second die 1700 having a second plurality of contact pads 1702. The second die 1700 includes an active area containing analog or digital circuits implemented as active devices, passive devices, conductive layers, and dielectric layers formed within the second die 1700 and are electrically interconnected according to the electrical design of the second die 1700. For example, the circuit may include one or more transistors, diodes, inductors, capacitors, resistors, and other circuit elements formed within the active area of the second die 1700. The second plurality of contact pads 1702 are made with a conductive material, such as aluminum (Al), copper (Cu), tin (Sn), nickel (Ni), gold (Au), or silver (Ag), and are electrically connected to the circuit elements formed within the second die 1700. The second plurality of contact pads 1702 is formed by PVD, CVD, electrolytic plating, or an electro-less plating process. The second die 1700 is attached to the laminate substrate 1610 using a second die attach adhesive 1704, which may be any suitable adhesive material used for die attachment, such as an epoxy, silver filled glass, solder, a thermal epoxy, a laminated polymer adhesive or an ultra-violet (UV) curable liquid adhesive, for example.

Figure 18:
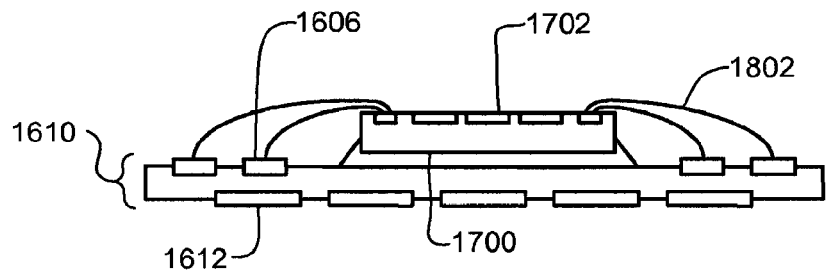
FIG. 18 is a cross-sectional view of the laminate substrate shown in FIG. 16 after wirebonding the second die to a second plurality of terminal pads on the laminate substrate.

Referring now to FIG. 18, therein is shown a cross-sectional view of the laminate substrate 1610 shown in FIG. 16 after wirebonding the second die 1700 to a second plurality of terminal leads 1606 on the laminate substrate 1610. The second plurality of contact pads 1702 on the second die 1700 is electrically connected to the second plurality of terminal leads 1606 by a second plurality of bond wires 1802. The second plurality of bond wires 1802 is a plurality of fine, conductive wires, typically gold (Au) or aluminum (Al). Wire bonding is typically done with automated wire bonding equipment employing well-known thermal-compression or ultrasonic wire bonding techniques.

Figure 19:
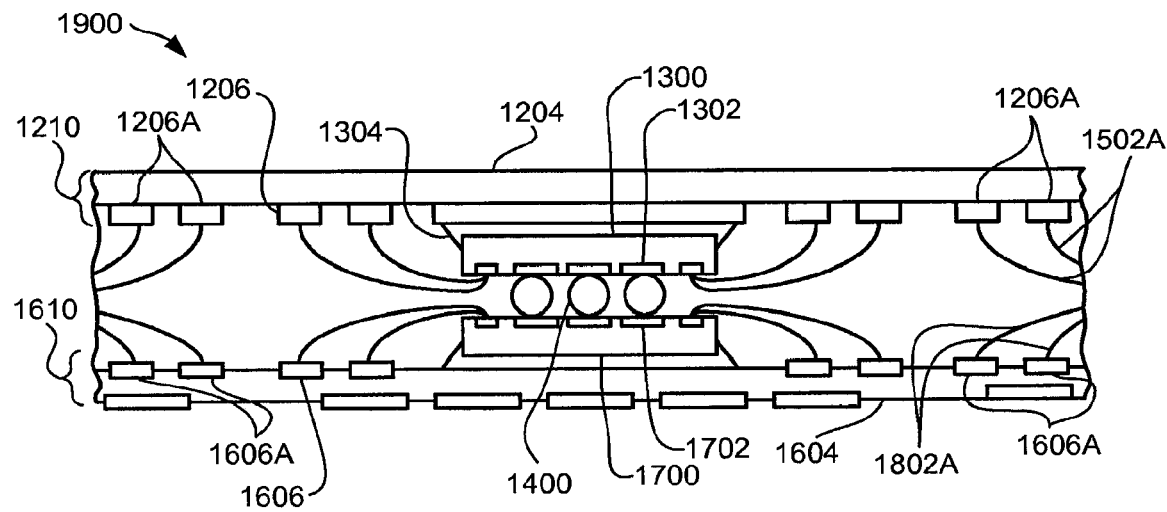
FIG. 19 is a cross-sectional view of an overlaying of the first frame shown in FIG. 15 and the laminate substrate shown in FIG. 18 after reflowing a plurality of die interconnects to form a stacked integrated circuit assembly.

Referring now to FIG. 19, therein is shown a cross-sectional view of an overlaying of the first frame 1210 shown in FIG. 15 and the laminate substrate 1610 shown in FIG. 18 after reflowing a plurality of die interconnects 1400 to form a stacked integrated circuit assembly 1900. The first frame 1210 is inverted and positioned over the laminate substrate 1610 so the plurality of die interconnects 1400 is aligned with the second plurality of contact pads 1702 on the second die 1700. The plurality of die interconnects 1400 is brought into contact with the second plurality of contact pads 1702, and then the plurality of die interconnects 1400 is reflowed by heating to form a connection between the first plurality of contact pads 1302 on the first die 1300 and the second plurality of contact pads 1702 on the second die 1700 to form the stacked integrated circuit assembly 1900.

An additional first plurality of terminal leads 1206A is shown as formed on the first removable backing element 1204, and an additional second plurality of terminal leads 1606A is shown formed on the laminate substrate 1610 to illustrate that the first frame 1210 and the laminate substrate 1610 may be formed in strips. An additional first plurality of bond wires 1502A would be wirebonded to the additional first plurality of terminal leads 1206A and to an additional die (not shown) positioned on either side of the first die 1300. Similarly, an additional second plurality of bond wires 1802A would be wirebonded to the additional second plurality of terminal pads 1606A and to an additional die (not shown) positioned on either side of the second die 1700.

Figure 20:
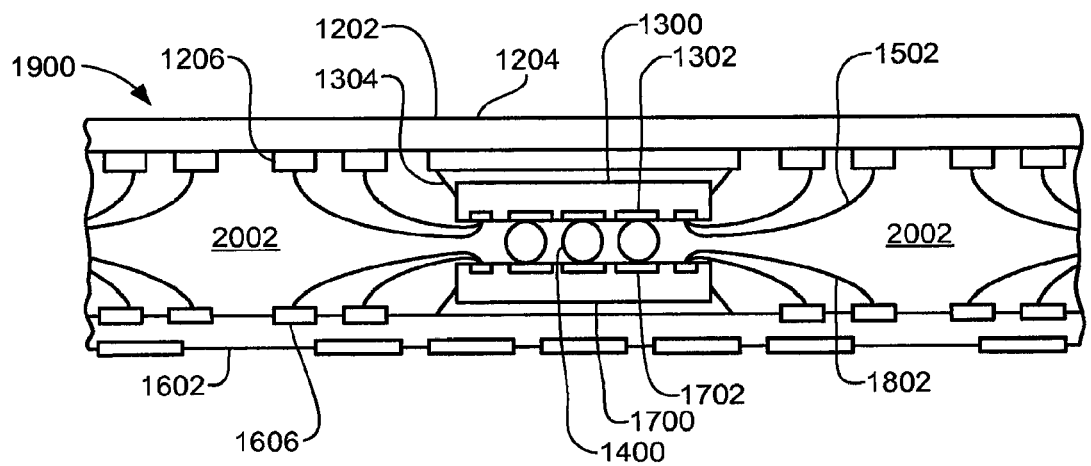
FIG. 20 is a cross-sectional view of the stacked integrated circuit assembly shown in FIG. 19 after a molding process.

Referring now to FIG. 20, therein is shown a cross-sectional view of the stacked integrated circuit assembly 1900 shown in FIG. 19 after a molding process. After the reflowing process described above with reference to FIG. 19, the stacked integrated circuit assembly 1900 undergoes a molding process. A molding material 2002 is formed in the space between the first frame 1210 and the laminate substrate 1610 to fill the space. The molding material 2002 may be any suitable material such as an epoxy, silicone, or polyimide based compound providing protection to the stacked integrated circuit assembly 1900.

Figure 21:
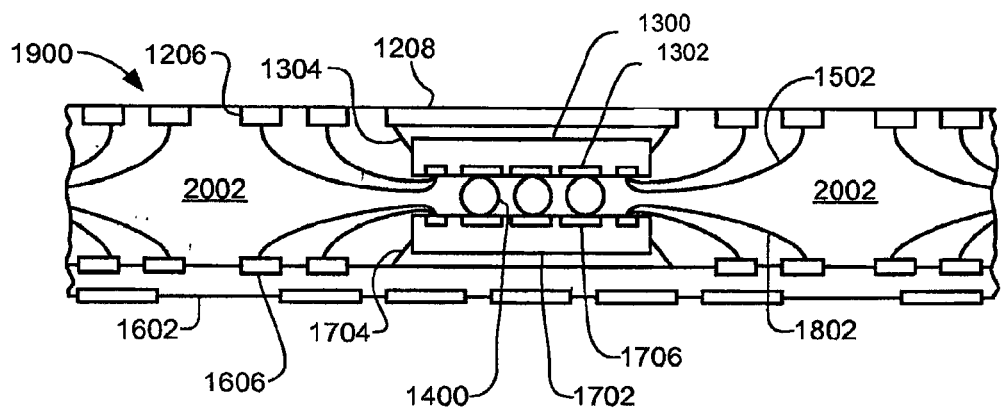
FIG. 21 is a cross-sectional view of the stacked integrated circuit assembly shown in FIG. 20 after removing a first removable backing element.

Referring now to FIG. 21, therein is shown a cross-sectional view of the stacked integrated circuit assembly 1900 shown in FIG. 20 after removing a first removable backing element 1204 shown in FIG. 20. The method of removing the first removable backing element 1204 depends upon the material used to form the first removable backing element 1204. For example, if the first removable backing element is formed of a metal, such as copper, as described above, the first removable backing element 1204 may be removed by selectively etching the first removable backing element 1204 with a suitable etchant. After removing the first removable backing element 1204 the undersides of the first plurality of terminal leads 1206 and the first die attach pad 1208 are exposed for possible connection to other packages or a to printed circuit board (PCB).

Figure 22:
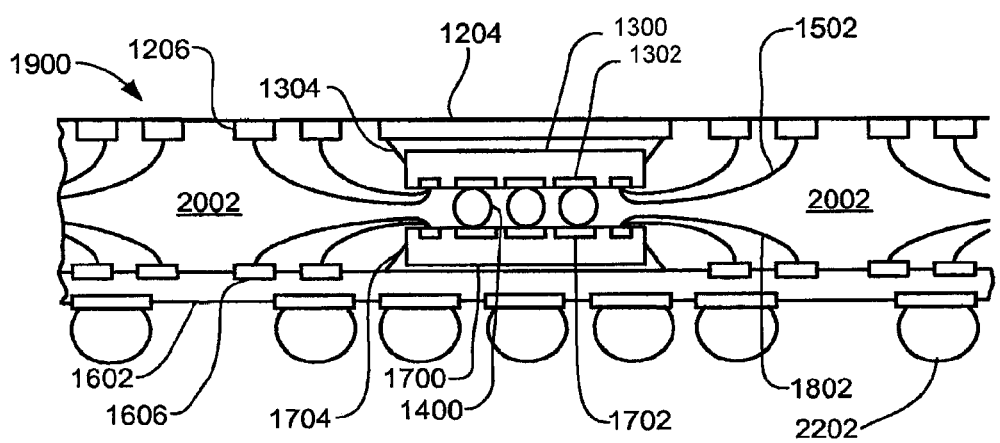
FIG. 22 is a cross-sectional view of the stacked integrated circuit assembly shown in FIG. 21 after a ball attach process.

Referring now to FIG. 22, therein is shown a cross-sectional view of the stacked integrated circuit assembly 1900 shown in FIG. 21 after a ball attach process. A plurality of solder balls 2202 is attached to the plurality of ball pads 1612 located on the bottom of the laminate substrate 1610 to provide an electrical interconnect path from the integrated circuit package system to other devices or printed circuit boards (PCBs). The plurality of solder balls 2202 typically are attached to the plurality of ball pads 1612 by applying a flux, placing the plurality of solder balls 2202 on the plurality of ball pads 1612, and reflowing the solder balls 2202.

Figure 23:
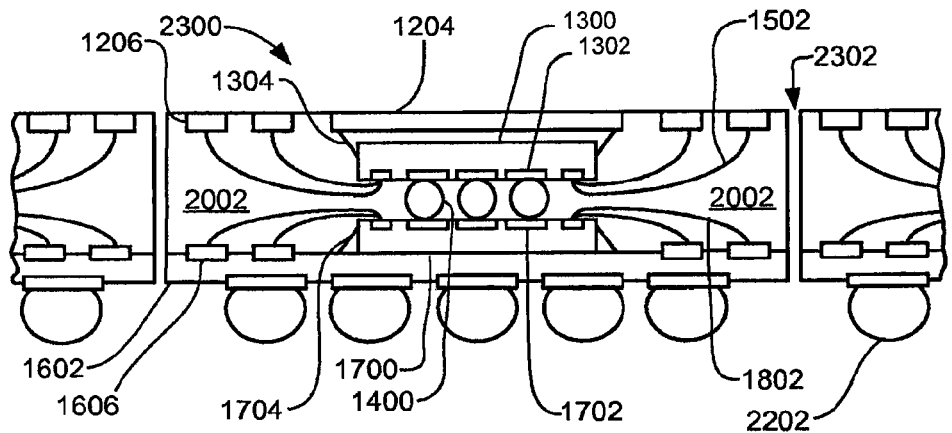
FIG. 23 is a cross-sectional view of the stacked integrated circuit assembly shown in FIG. 22 after a singulation process.

Referring now to FIG. 23, therein is shown a cross-sectional view of the stacked integrated circuit assembly 1900 shown in FIG. 22 after a singulation process. After the first removable backing element 1204 is removed, a package singulation process is performed to obtain a stacked integrated circuit package system 2300. Any suitable singulation process may be used, such as sawing or laser cutting to cut through the molding material 2002 to form a space 2302 to define the stacked integrated circuit package system 2300.

Figure 24:
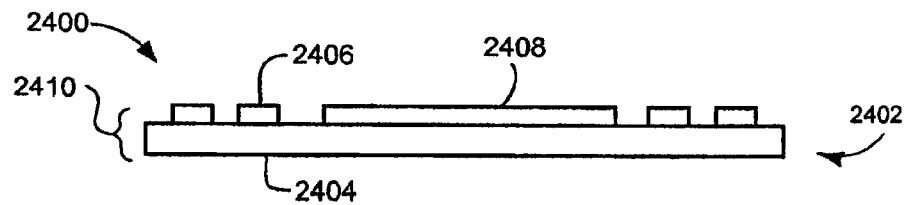
FIG. 24 is a cross-sectional view of an embodiment of an integrated circuit package system of the present invention at an intermediate stage of manufacture.

Referring now to FIG. 24, therein is shown a cross-sectional view of an embodiment of an integrated circuit package system 2400 of the present invention at an intermediate stage of manufacture. The integrated circuit package system 2400 includes a first substrate 2402. The first substrate 2402 includes a first removable backing element 2404 with a first plurality of terminal leads 2406 and a first die attach pad 2408 to form a first frame 2410. As shown in FIG. 24, the first frame 2410 is manufactured from a first removable backing element 2404 from a material that can be etched or otherwise removed from the first plurality of terminal leads 2406 and the first die attach pad 2408. Accordingly, the first removable backing element 2404 can be manufactured from a metal, such as copper, such as by stamping, or otherwise forming the first removable backing element 2404. The first plurality of terminal leads 2406 and the first die attach pad 2408 are plated, or otherwise positioned and formed onto the first removable backing element 2404.

The first frame 2410 typically is formed as a strip (not shown) of the first frames 2410 to enable assembly of several integrated circuit package systems 2400 at the same time.

Figure 25:
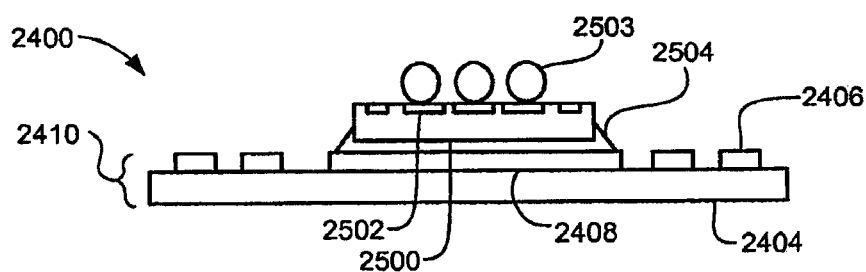
FIG. 25 is a cross-sectional view of a first frame shown in FIG. 24 after die attach of a first die.

Referring now to FIG. 25, therein is shown a cross-sectional view of a first frame 2410 shown in FIG. 24 after die attach of a first die 2500. The first die 2500 includes an active area containing analog or digital circuits implemented as active devices, passive devices, conductive layers, and dielectric layers formed within the first die 2500 and are electrically interconnected according to the electrical design of the first die 2500. For example, the circuit may include one or more transistors, diodes, inductors, capacitors, resistors, and other circuit elements formed within the active area of the first die 2500. The first plurality of contact pads 2502 are made with a conductive material, such as aluminum (Al), copper (Cu), tin (Sn), nickel (Ni), gold (Au), or silver (Ag), and are electrically connected to the circuit elements formed within the first die 2500. The first plurality of contact pads 2502 is formed by PVD, CVD, electrolytic plating, or an electroless plating process.

The first die 2500 is pre-bumped. A plurality of die interconnects 2503, such as a plurality of solder bumps, is formed on selected ones of the first plurality of contact pads 2502 on the first die 2500 using well known techniques before the first die 2500 is attached to the first frame 2410.

The plurality of die interconnects 2503 can be any metal or electrically conductive material, e.g., Sn, lead (Pb), Au, Ag, Cu, zinc (Zn), bismuthinite (Bi), and alloys thereof. For example, the solder material can be eutectic Sn/Pb, high-lead, or lead-free solder. A solder material is deposited over selected ones of the first plurality of contact pads 2502 using a ball drop or stencil printing process, for example. The solder (or other conductive material) is reflowed to form the plurality of die interconnects 2503.

The first die 2500 is attached to the first die attach pad 2408 using a first die attach adhesive 2504, which may be any suitable adhesive material used for die attachment, such as an epoxy, silver filled glass, solder, a thermal epoxy, a laminated polymer adhesive or an ultra-violet (UV) curable liquid adhesive, for example.

Figure 26:
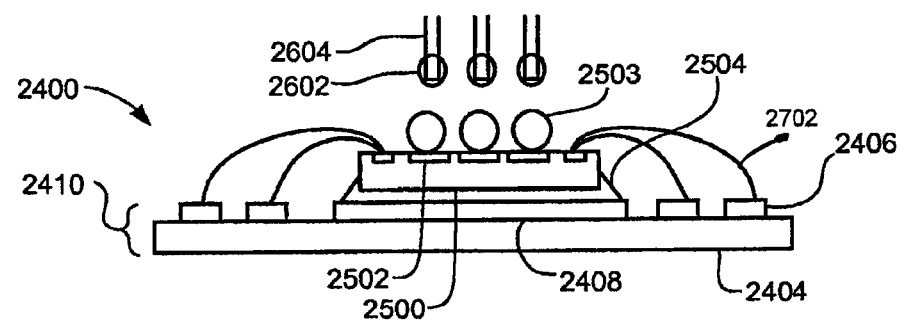
FIG. 26 is a cross-sectional view of the first frame shown in FIG. 25 illustrating the application of a first optional flux to a plurality of die interconnects on the first die.

Referring now to FIG. 26, therein is shown a cross-sectional view of the first frame 2410 shown in FIG. 25 illustrating the application of a first optional flux 2602 to a plurality of die interconnects 2503 on the first die 2500. The first optional flux 2602 may be applied to the plurality of die interconnects 2503 using a plurality of pins 2604 that have been dipped into a flux material. The pins are moved toward the plurality of die interconnects 2503 until the first optional flux 2602 transfers to the surface of the plurality of die interconnects 2503 to provide a wettable surface on the plurality of die interconnects 2503.

Figure 27:
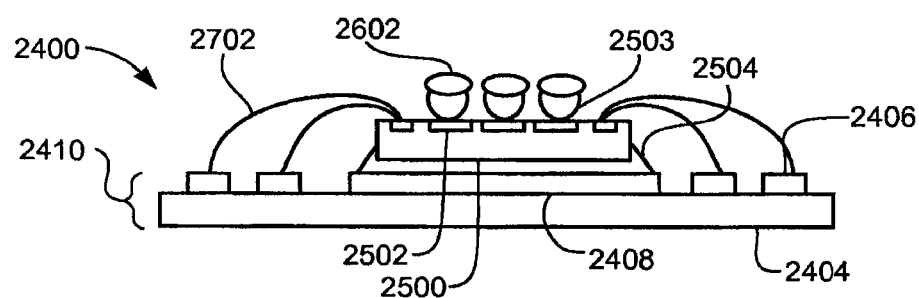
FIG. 27 is a cross-sectional view of the first frame shown in FIG. 26 after application of the first optional flux to the plurality of die interconnects and wirebonding.

Referring now to FIG. 27, therein is shown a cross-sectional view of the first frame 2410 shown in FIG. 26 after application of the first optional flux 2602 to the plurality of die interconnects 2503 and wirebonding. The first optional flux 2602 has transferred to the surface of the plurality of die interconnects 2503 to provide a plurality of wettable surfaces on the plurality of die interconnects 2503.

The first plurality of contact pads 2502 on the first die 2500 is electrically connected to the first plurality of terminal leads 2406 by a plurality of bond wires 2702. The first plurality of bond wires 2702 is a plurality of fine, conductive wires, typically gold (Au) or aluminum (Al). Wire bonding is typically done with automated wire bonding equipment employing well-known thermal-compression or ultrasonic wire bonding techniques.

Figure 28:
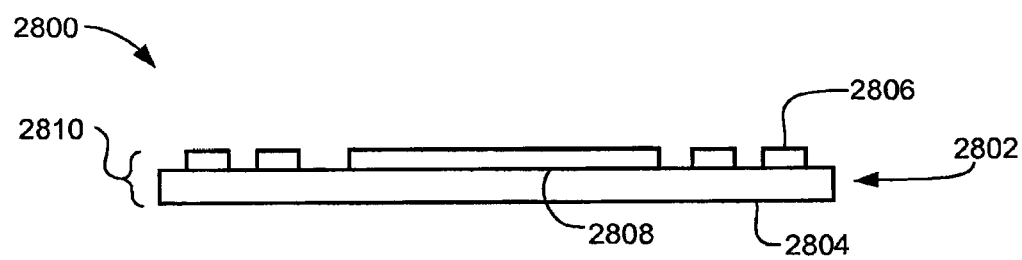
FIG. 28 is a cross-sectional view of a second substrate.

Referring now to FIG. 28, therein is shown a cross-sectional view of a second substrate 2802. The second substrate 2802 includes a second removable backing element 2804 with a second plurality of terminal leads 2806 and a second die attach pad 2808 to form a second frame 2810.

The second frame 2810 is manufactured from the second removable backing element 2804 from a material that can be etched or otherwise removed from the second plurality of terminal leads 2806 and the second die attach pad 2808. Accordingly, the second removable backing element 2804 can be manufactured from a metal, such as copper, such as by stamping, or otherwise forming the second removable backing element 2804. The second plurality of terminal leads 2806 and the second die attach pad 2808 are plated, or otherwise positioned and formed onto the second removable backing element 2804.

The second frame 2810 typically is formed as a strip (not shown) of the second frames 2810 to enable assembly of several integrated circuit package systems 2400 at the same time.

Figure 29:
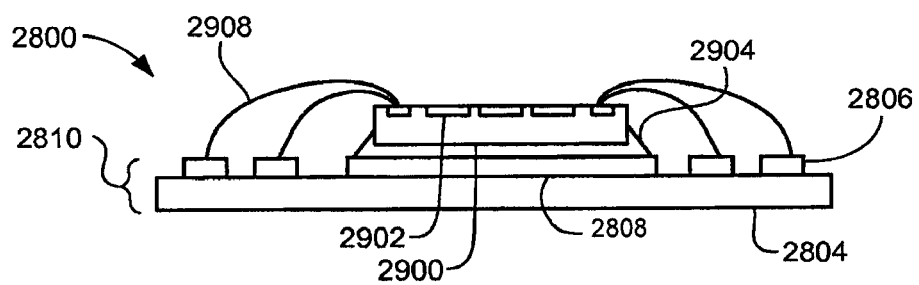
FIG. 29 is a cross-sectional view of a second frame shown in FIG. 28 after die attach and wirebonding of a second die having a second plurality of contact pads.

Referring now to FIG. 29, therein is shown a cross-sectional view of a second frame 2810 shown in FIG. 28 after die attach and wirebonding of a second die 2900 having a second plurality of contact pads 2902. The second die 2900 includes an active area containing analog or digital circuits implemented as active devices, passive devices, conductive layers, and dielectric layers formed within the second die 2900 and are electrically interconnected according to the electrical design of the second die 2900. For example, the circuit may include one or more transistors, diodes, inductors, capacitors, resistors, and other circuit elements formed within the active area of the second die 2900. The second plurality of contact pads 2902 is made with a conductive material, such as aluminum (Al), copper (Cu), tin (Sn), nickel (Ni), gold (Au), or silver (Ag), and are electrically connected to the circuit elements formed within the second die 2900. The second plurality of contact pads 2902 is formed by PVD, CVD, electrolytic plating, or an electro-less plating process. The second die 2900 is attached to the second die attach pad 2808 using a second die attach adhesive 2904, which may be any suitable adhesive material used for die attachment, such as an epoxy, silver filled glass, solder, a thermal epoxy, a laminated polymer adhesive or an ultra-violet (UV) curable liquid adhesive, for example.

The second plurality of contact pads 2902 on the second die 2900 is electrically connected to the second plurality of terminal leads 2806 by a second plurality of bond wires 2908. The second plurality of bond wires 2908 is a plurality of fine, conductive wires, typically gold (Au) or aluminum (Al). Wire bonding is typically done with automated wire bonding equipment employing well-known thermal-compression or ultrasonic wire bonding techniques.

Figure 30:
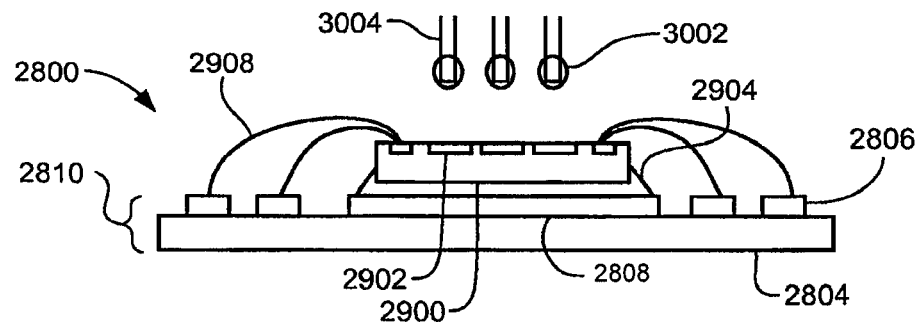
FIG. 30 is a cross-sectional view of the second frame shown in FIG. 29 illustrating the application of a second optional flux to the second plurality of contact pads on the second die.

Referring now to FIG. 30, therein is shown a cross-sectional view of the second frame 2810 shown in FIG. 29 illustrating the application of a second optional flux 3002 to the second plurality of contact pads 2902 on the second die 2900. The second optional flux 3002 may be applied to the second plurality of contact pads 2902 using a plurality of pins 3004 that have been dipped into a flux material. The plurality of pins 3004 are moved toward the second plurality of contact pads 2902 until the second optional flux 3002 transfers to the surface of the second plurality of contact pads 2902 to provide a wettable surface on the second plurality of contact pads 2902.

Figure 31:
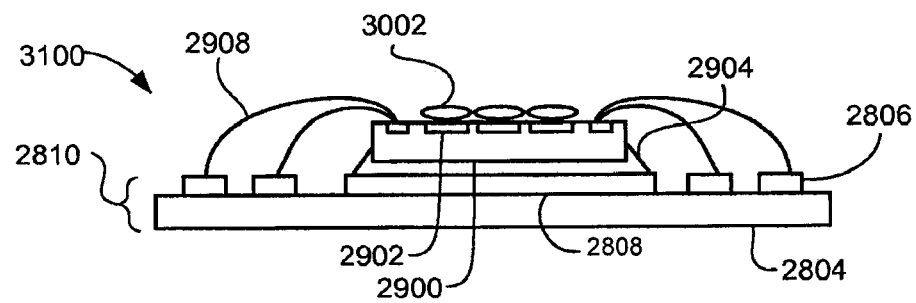
FIG. 31 is a cross-sectional view of the first frame shown in FIG. 30 after application of the second optional flux to the plurality of die interconnects and wirebonding.

Referring now to FIG. 31, therein is shown a cross-sectional view of the first frame 2810 shown in FIG. 30 after application of the second optional flux 3002 to the plurality of die interconnects 2503 and wirebonding. The second optional flux 3002 has transferred to the surface of the second plurality of contact pads 2902 to provide a plurality of wettable surfaces on the second plurality of contact pads 2902.

It will be apparent that the application of the first optional flux 2602 as discussed above with reference to FIGS. 26 and 27 and the application of the second optional flux 3002 as discussed above with reference to FIGS. 30 and 31 may both be used if necessary for a particular application. Only the first optional flux 2602, only the second optional flux 3002, or neither flux also may be used depending upon the particular integrated circuit package design in question.

Figure 32:
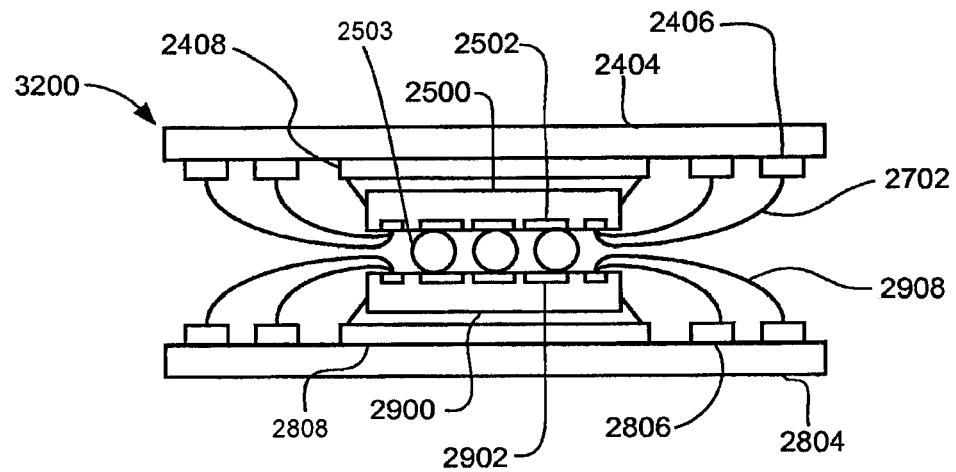
FIG. 32 is a cross-sectional view illustrating the overlaying of the first frame shown in FIG. 27 and a second frame shown in FIG. 31 after reflowing the plurality of die interconnects to form a stacked integrated circuit assembly.

Referring now to FIG. 32, therein is shown a cross-sectional view illustrating the overlaying of the first frame 2410 shown in FIG. 27 and a second frame 2810 shown in FIG. 31 after reflowing the plurality of die interconnects 2503 to form a stacked integrated circuit assembly 3200. The first frame 2410 is inverted and positioned over the second frame 2810 so the plurality of die interconnects 2503 is aligned with the second plurality of contact pads 2902 on the second die 2900. The plurality of die interconnects 2404 is brought into contact with the second plurality of contact pads 2902, and the plurality of die interconnects 2503 is reflowed by heating to form a connection between the first plurality of contact pads 2502 on the first die 2500 and the second plurality of contact pads 2902 on the second die 2900 to form the stacked integrated circuit assembly 3200.

Figure 33:
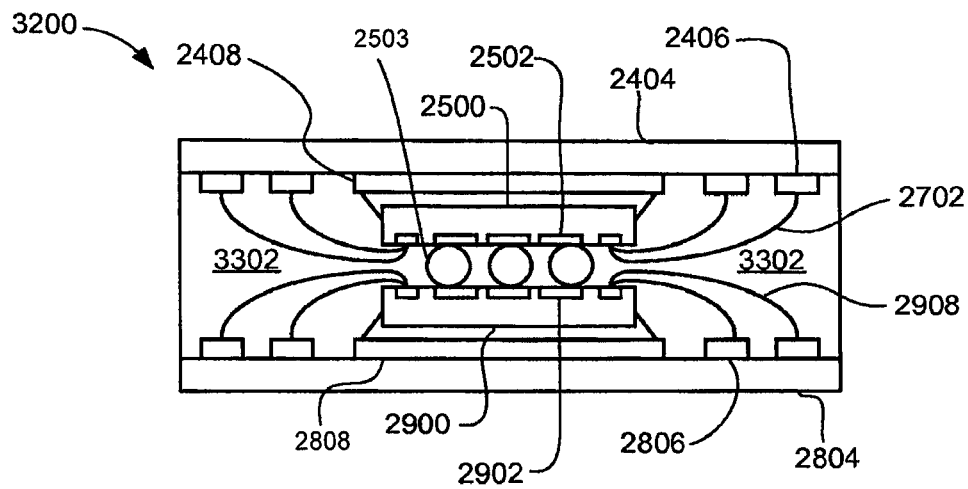
FIG. 33 is a cross-sectional view of the stacked integrated circuit assembly shown in FIG. 32 after a molding process.

Referring now to FIG. 33, therein is shown a cross-sectional view of the stacked integrated circuit assembly 3200 shown in FIG. 32 after a molding process. After the reflowing process described above with reference to FIG. 32, the stacked integrated circuit assembly 3200 undergoes a molding process. A molding material 3302 is formed in the space between the first frame 2410 and the second frame 2810 to fill the space. The molding material 3302 may be any suitable material such as an epoxy, silicone, or polyimide based compound providing protection to the stacked integrated circuit assembly 3200.

Figure 34:
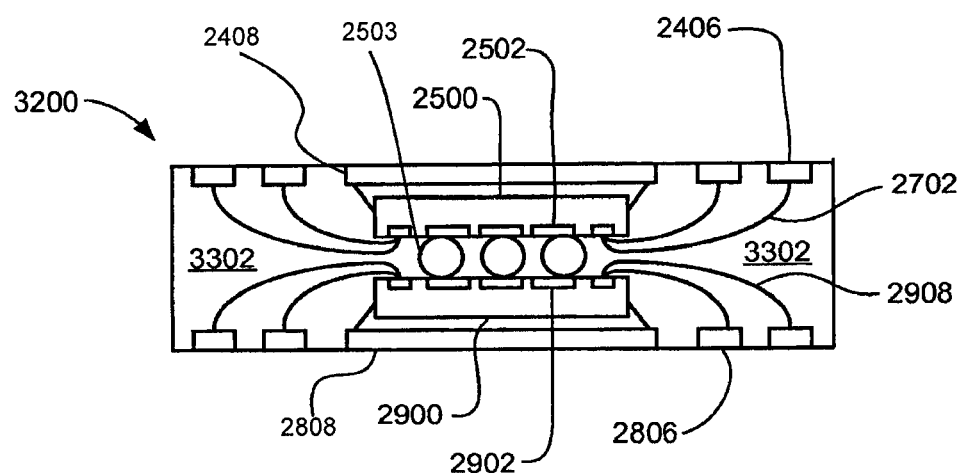
FIG. 34 is a cross-sectional view of the stacked integrated circuit assembly shown in FIG. 33 after removing a first removable backing element and a second removable backing element to form a stacked integrated circuit package system.

Referring now to FIG. 34, therein is shown a cross-sectional view of the stacked integrated circuit assembly 3200 shown in FIG. 33 after removing a first removable backing element 2404 and a second removable backing element 2804 to form a stacked integrated circuit package system 3200. The first removable backing element 2404 and the second removable backing element 2804 are collectively referred to herein as the removable backing elements. The method of removing the removable backing elements depends upon the material used to form the removable backing elements. For example, if the removable backing elements are formed of a metal, such as copper, as described above, the removable backing elements may be removed by selectively etching the removable backing elements with a suitable etchant. After removing the removable backing elements the undersides of the first plurality of terminal leads 2406, the first die attach pad 2408, the second plurality of terminal leads 2806, and the second die attach pad 2808 are exposed for possible connection to other packages or a to printed circuit board (PCB).

It will be apparent to those skilled in the art that if the stacked integrated circuit package system 3200 is manufactured using frames in strip form, a singulation process such as that described above with reference to FIGS. 11 and 23 may be used to singulate the packages.

Figure 35:
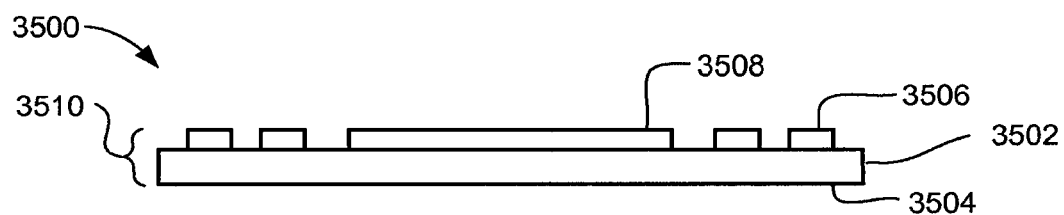
FIG. 35 is a cross-sectional view of an integrated circuit package system in accordance with an embodiment of the present invention at an intermediate stage of manufacture.

Referring now to FIG. 35, therein is shown a cross-sectional view of an integrated circuit package system 3500 in accordance with an embodiment of the present invention at an intermediate stage of manufacture. The integrated circuit package system 3500 includes a first substrate 3502. The first substrate 3502 includes a first removable backing element 3504 with a first plurality of terminal leads 3506 and a first die attach pad 3508 to form a first frame 3510.

The first frame 3510 is manufactured from a first removable backing element 3504 from a material that can be etched or otherwise removed from the first plurality of terminal leads 3506 and the first die attach pad 3508. Accordingly, the first removable backing element 3504 can be manufactured from a metal, such as copper, such as by stamping, or otherwise forming the first removable backing element 3504. The first plurality of terminal leads 3506 and the first die attach pad 3508 are plated, or otherwise positioned and formed onto the first removable backing element 3504.

The first frame 3510 typically is formed as strip (not shown) of the first frames 3510 to enable assembly of several integrated circuit package systems 3500 at the same time.

Figure 36:
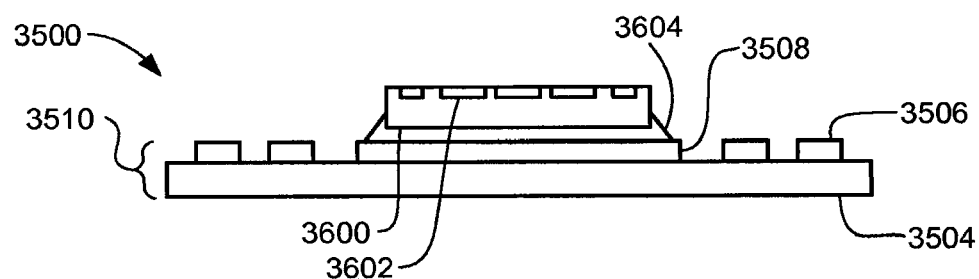
FIG. 36 is a cross-sectional view of a first frame shown in FIG. 35 after die attach of a first die.

Referring now to FIG. 36, therein is shown a cross-sectional view of a first frame 3510 shown in FIG. 35 after die attach of a first die 3600. The first die 3600 includes an active area containing analog or digital circuits implemented as active devices, passive devices, conductive layers, and dielectric layers formed within the first die 3600 and are electrically interconnected according to the electrical design of the first die 3600. For example, the circuit may include one or more transistors, diodes, inductors, capacitors, resistors, and other circuit elements formed within the active area of the first die 3600. The first plurality of contact pads 3602 are made with a conductive material, such as aluminum (Al), copper (Cu), tin (Sn), nickel (Ni), gold (Au), or silver (Ag), and are electrically connected to the circuit elements formed within the first die 3600. The first plurality of contact pads 3602 is formed by PVD, CVD, electrolytic plating, or an electroless plating process. The first die 3600 is attached to the first die attach pad 3508 using a first die attach adhesive 3604, which may be any suitable adhesive material used for die attachment, such as an epoxy, silver filled glass, solder, a thermal epoxy, a laminated polymer adhesive or an ultra-violet (UV) curable liquid adhesive, for example.

Figure 37:
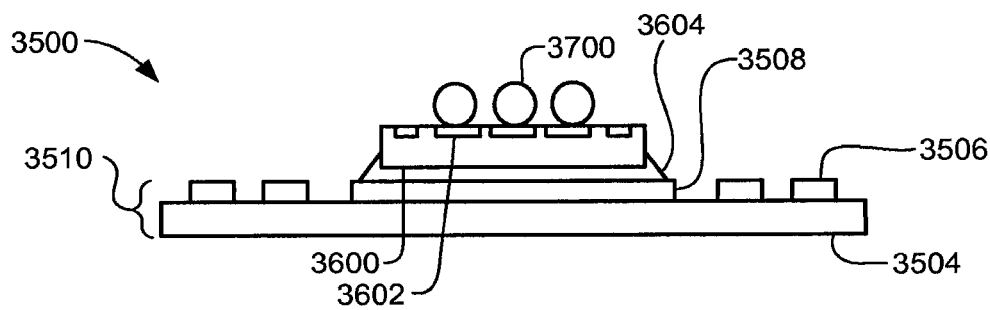
FIG. 37 is a cross-sectional view of the first frame shown in FIG. 36 after a die interconnect stage of manufacture.

Referring now to FIG. 37, therein is shown a cross-sectional view of the first frame 3510 shown in FIG. 36 after a die interconnect stage of manufacture. A plurality of die interconnects 3700, such as a plurality of solder bumps, is attached to the first plurality of contact pads 3602 on the first die 3600 using readily available die interconnect forming processes, such as solder bump forming processes, that are available in the semiconductor manufacturing industry. The plurality of die interconnects 3700 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free solder. A solder material is deposited over selected ones of the first plurality of contact pads 3602 using a ball drop or stencil printing process, for example. The solder material includes an electrically conductive material such as Sn, Pb, Au, Ag, Cu, Zn, Bi, and alloys thereof, with an optional flux material. For example, the solder material can be eutectic Sn/Pb, high lead, or lead free. The solder (or other conductive material) is reflowed to form the plurality of die interconnects 3700.

Figure 38:
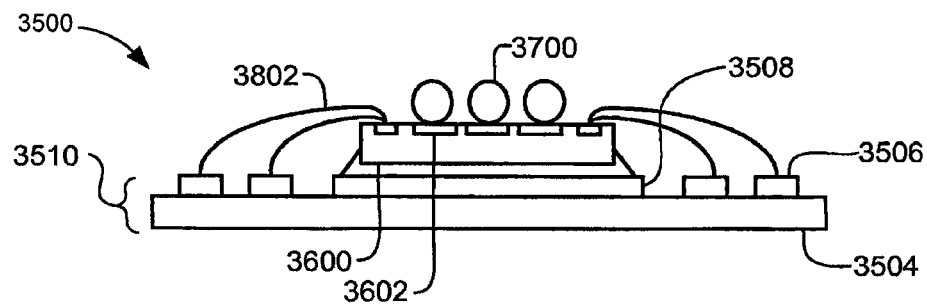
FIG. 38 is a cross-sectional view of the first frame shown in FIG. 37 after wirebonding the first die to a first plurality of terminal pads on the first frame.

Referring now to FIG. 38, therein is shown a cross-sectional view of the first frame 3510 shown in FIG. 37 after wirebonding the first die 3600 to a first plurality of terminal leads 3506 on the first frame 3510. The first plurality of contact pads 3602 on the first die 3600 is electrically connected to the first plurality of terminal leads 3506 by a first plurality of bond wires 3802. The first plurality of bond wires 3802 is a plurality of fine, conductive wires, typically gold (Au) or aluminum (Al). Wire bonding is typically done with automated wire bonding equipment employing well-known thermal-compression or ultrasonic wire bonding techniques.

Figure 39:
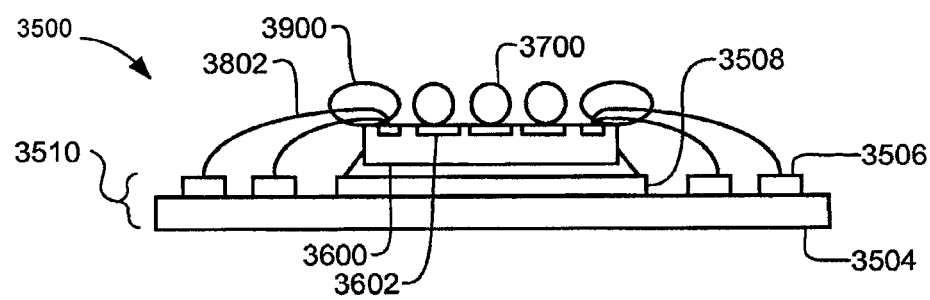
FIG. 39 is a cross-sectional view of the first frame shown in FIG. 38 after a wire lock process.

Referring now to FIG. 39, therein is shown a cross-sectional view of the first frame 3510 shown in FIG. 38 after a wire lock process. The first plurality of bond wires 3802 may be subject to partial or total dislodging or cracking from the first plurality of contact pads 3602 on the first die 3600 during subsequent manufacture of the first frame 3510 such as during subsequent molding processes as described below. It has been discovered that the harmful effect of such dislodgement or cracking can be reduced or eliminated if the wirebonds at the first plurality of contact pads 3602 undergo a wire lock process.

Application of a wire lock 3900 to the wirebonds at the first plurality of contact pads 3602 secures the wirebonds and reduces or eliminates dislodgement of the wirebond. The wire lock 3900 preferably is a curable adhesive, such as a B-stage adhesive, that can be applied to the wirebonds in liquid or paste form and then cured.

Figure 40:
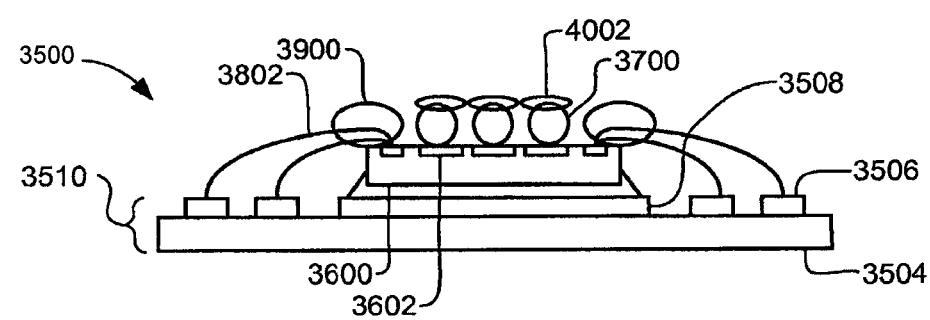
FIG. 40 is a cross-sectional view of the first frame shown in FIG. 39 after application of a first optional flux to a plurality of die interconnects on the first die.

Referring now to FIG. 40, therein is shown a cross-sectional view of the first frame 3510 shown in FIG. 39 after application of a first optional flux 4002 to a plurality of die interconnects 3700 on the first die 2500. The first optional flux 4002 may be applied to the plurality of die interconnects 3700 using a plurality of pins 4004 that have been dipped into a flux material. The pins are moved toward the plurality of die interconnects 3700 until the first optional flux 4002 transfers to the surface of the plurality of die interconnects 3700 to provide a wettable surface on the plurality of die interconnects 3700.

Figure 41:
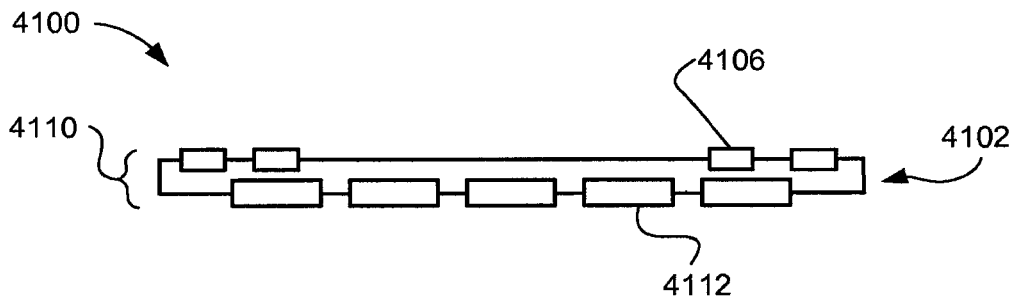
FIG. 41 is a cross-sectional view of a second substrate.

Referring now to FIG. 41, therein is shown a cross-sectional view of a second substrate 4102. The second substrate 4102 is formed of a suitable material to form a laminate substrate 4110. A variety of suitable materials are available for use as the laminate substrate 4110 such as BT resin substrates or any other type of printed wiring boards, etched wiring board, or laminate, made for example, of one or more layers of ceramic, paper impregnated with phenolic resin such as FR-2, woven fiberglass mat impregnated with a flame retardant epoxy resin such as FR-4, plastic with low dielectric constant such as Teflon, polyimide, polystyrene and cross-linked polystyrene.

The laminate substrate 4110 includes a plurality of bonding pads 4106 formed on the upper surface of the laminate substrate 4110. The laminate substrate 4110 also has a plurality of ball pads 4112 formed in the lower surface of the laminate substrate 4110. The plurality of bonding pads 4106 and the plurality of ball pads 4112 are formed using conventional processing techniques.

The laminate substrate 4110 typically is formed as a strip (not shown) of the laminate substrates 4110 to enable assembly of several integrated circuit package systems 3500 at the same time.

Figure 42:
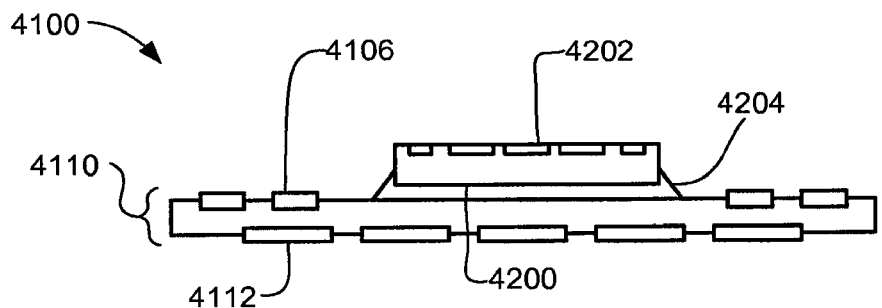
FIG. 42 is a cross-sectional view of a laminate substrate shown in FIG. 41 after die attach of a second die having a second plurality of contact pads.

Referring now to FIG. 42, therein is shown a cross-sectional view of a laminate substrate 4110 shown in FIG. 41 after die attach of a second die 4200 having a second plurality of contact pads 4202. The second die 4200 includes an active area containing analog or digital circuits implemented as active devices, passive devices, conductive layers, and dielectric layers formed within the second die 4200 and are electrically interconnected according to the electrical design of the second die 4200. For example, the circuit may include one or more transistors, diodes, inductors, capacitors, resistors, and other circuit elements formed within the active area of the second die 4200. The second plurality of contact pads 4202 are made with a conductive material, such as aluminum (Al), copper (Cu), tin (Sn), nickel (Ni), gold (Au), or silver (Ag), and are electrically connected to the circuit elements formed within the second die 4200. The second plurality of contact pads 4202 is formed by PVD, CVD, electrolytic plating, or an electro-less plating process. The second die 4200 is attached to the laminate substrate 4110 using a second die attach adhesive 4204, which may be any suitable adhesive material used for die attachment, such as an epoxy, silver filled glass, solder, a thermal epoxy, a laminated polymer adhesive or an ultra-violet (UV) curable liquid adhesive, for example.

Figure 43:
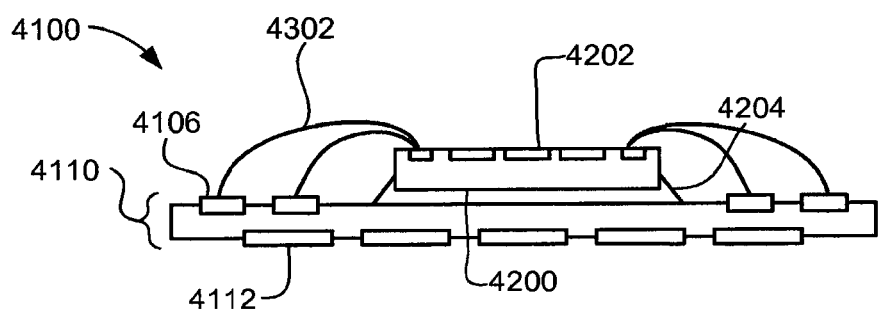
FIG. 43 is a cross-sectional view of the laminate substrate shown in FIG. 42 after wirebonding the second die to a plurality of contact pads on the laminate substrate.

Referring now to FIG. 43, therein is shown a cross-sectional view of the laminate substrate 4110 shown in FIG. 42 after wirebonding the second die 4200 to a plurality of bonding pads 4106 on the laminate substrate 4110. The second plurality of contact pads 4202 on the second die 4200 is electrically connected to the second plurality of bonding pads 4106 by a second plurality of bond wires 4302. The second plurality of bond wires 4302 is a plurality of fine, conductive wires, typically gold (Au) or aluminum (Al). Wire bonding is typically done with automated wire bonding equipment employing well-known thermal-compression or ultrasonic wire bonding techniques.

Figure 44:
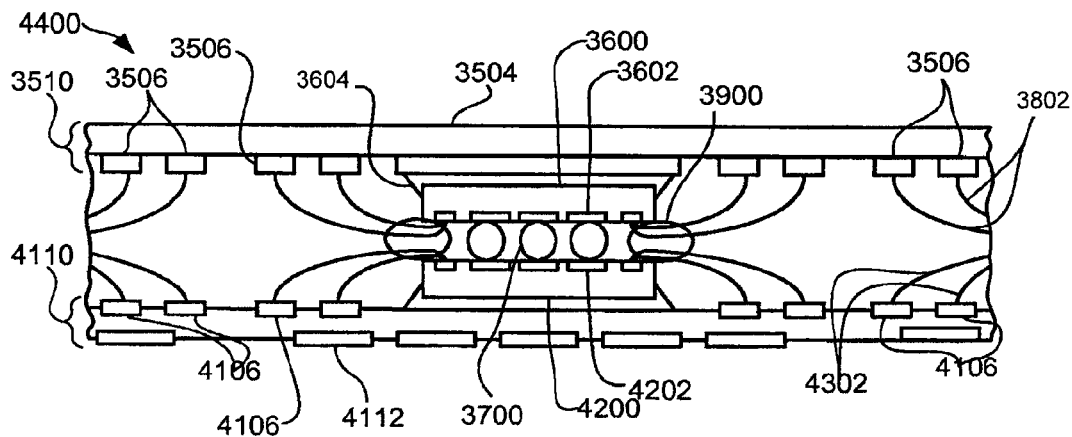
FIG. 44 is a cross-sectional view illustrating the overlaying of the first frame shown in FIG. 40 over the laminate substrate shown in FIG. 43 after reflowing a plurality of die interconnects to form a stacked integrated circuit assembly.

Referring now to FIG. 44, therein is shown a cross-sectional view illustrating the overlaying of the first frame 3510 shown in FIG. 40 over the laminate substrate 4110 shown in FIG. 43 after reflowing a plurality of die interconnects 3700 to form a stacked integrated circuit assembly 4400. The first frame 3510 is inverted and positioned over the laminate substrate 4110 so the plurality of die interconnects 3700 is aligned with the second plurality of contact pads 4202 on the second die 4200. The plurality of die interconnects 3700 is brought into contact with the second plurality of contact pads 4202, and then the plurality of die interconnects 3700 is reflowed by heating to form a connection between the first plurality of contact pads 3602 on the first die 3600 and the second plurality of contact pads 4202 on the second die 4200 to form the stacked integrated circuit assembly 4400.

Figure 45:
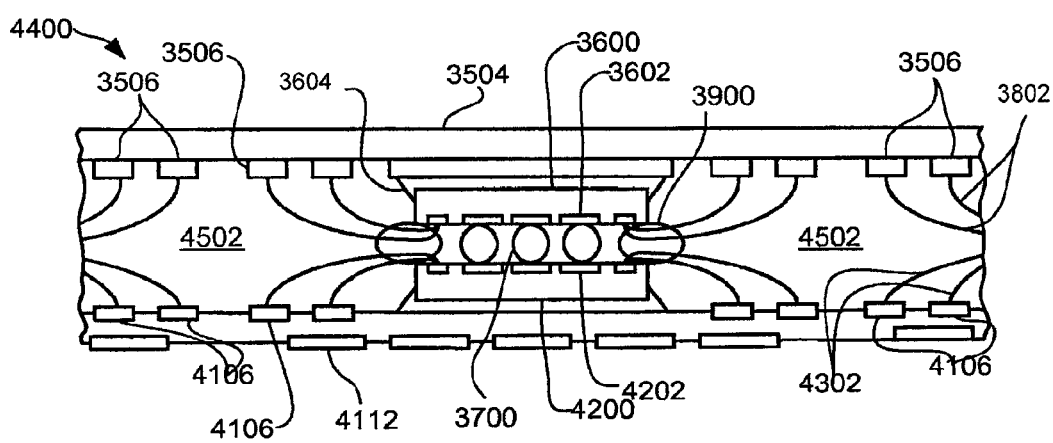
FIG. 45 is a cross-sectional view of the stacked integrated circuit assembly shown in FIG. 44 after a molding process.

Referring now to FIG. 45, therein is shown a cross-sectional view of the stacked integrated circuit assembly 4400 shown in FIG. 44 after a molding process. After the reflowing process described above with reference to FIG. 44, the stacked integrated circuit assembly 4400 undergoes a molding process. A molding material 4502 is formed in the space between the first frame 3510 and the laminate substrate 4110 to fill the space. The molding material 4502 may be any suitable material such as an epoxy, silicone, or polyimide based compound providing protection to the stacked integrated circuit assembly 4400.

Figure 46:
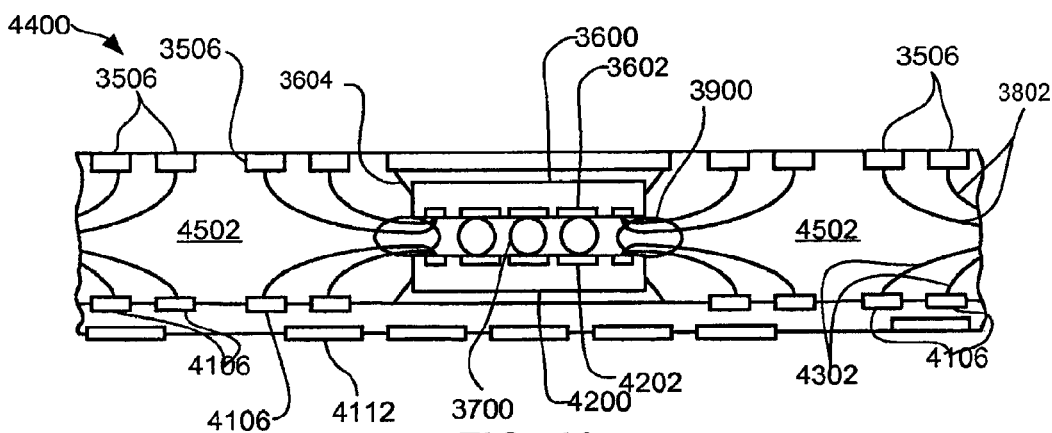
FIG. 46 is a cross-sectional view of the stacked integrated circuit assembly shown in FIG. 45 after removing a first removable backing element.

Referring now to FIG. 46, therein is shown a cross-sectional view of the stacked integrated circuit assembly 4400 shown in FIG. 45 after removing a first removable backing element 3504. The method of removing the first removable backing element 3504 depends upon the material used to form the first removable backing element 3504. For example, if the first removable backing element is formed of a metal, such as copper, as described above, the first removable backing element 3504 may be removed by selectively etching the first removable backing element 3504 with a suitable etchant. After removing the first removable backing element 3504 the undersides of the first plurality of terminal leads 3506 and the first die attach pad 3508 are exposed for possible connection to other packages or to a printed circuit board (PCB).

It will be apparent to those skilled in the art that if the stacked integrated circuit package system 4400 is manufactured using frames in strip form, a singulation process such as that described above with reference to FIGS. 11 and 23.

Figure 47:
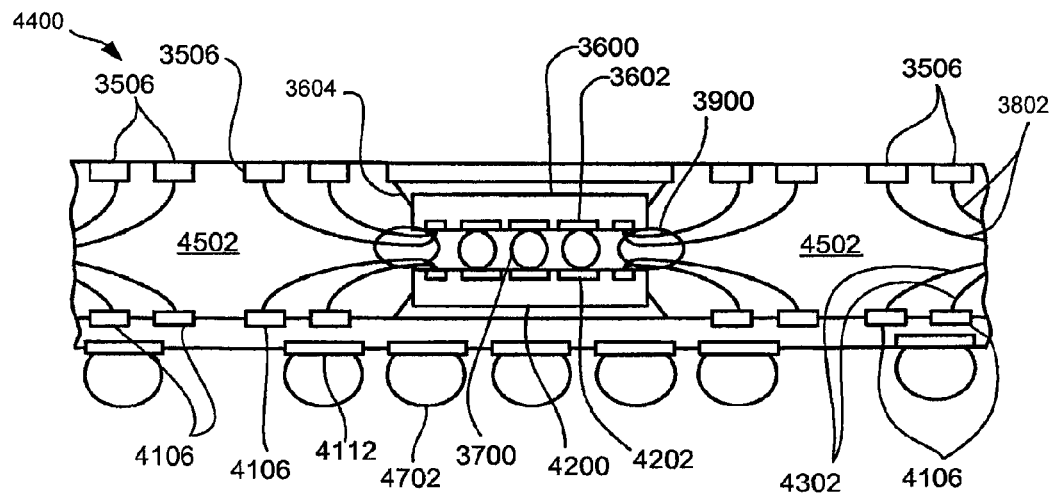
FIG. 47 is a cross-sectional view of the stacked integrated circuit assembly shown in FIG. 46 after a ball attach process.

Referring now to FIG. 47, therein is shown a cross-sectional view of the stacked integrated circuit assembly 4400 shown in FIG. 46 after a ball attach process. A plurality of solder balls 4702 is attached to the plurality of ball pads 4112 located on the bottom of the laminate substrate 4110 to provide an electrical interconnect path from the integrated circuit package system to other devices or printed circuit boards (PCBs) (not shown). The plurality of solder balls 4702 typically are attached to the plurality of ball pads 4112 by applying a flux, placing the solder balls 4702 on the plurality of ball pads 4112, and reflowing the plurality of solder balls 4702.

Figure 48:
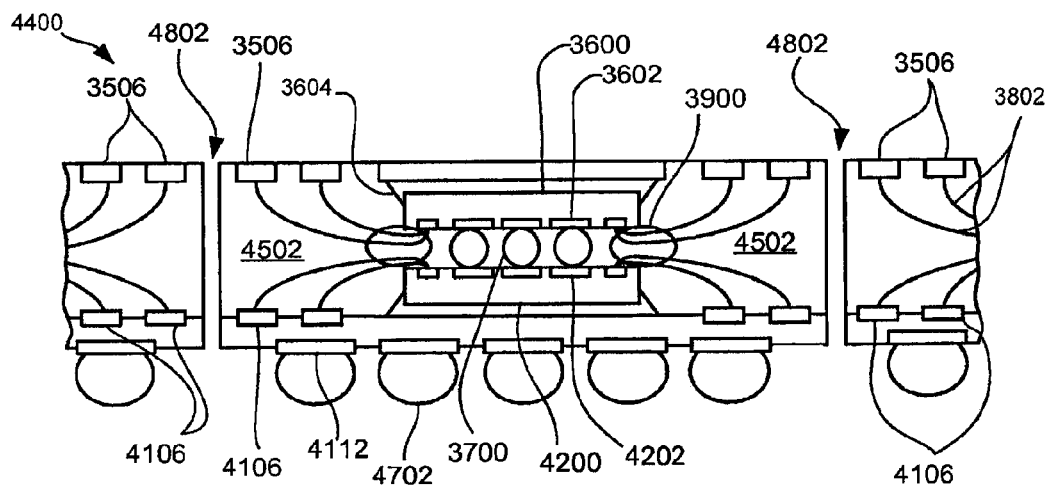
FIG. 48 is a cross-sectional view of the stacked integrated circuit assembly shown in FIG. 47 after a singulation process.

Referring now to FIG. 48, therein is shown a cross-sectional view of the stacked integrated circuit assembly 4400 shown in FIG. 47 after a singulation process. After the removable backing elements are removed, a package singulation process is performed to obtain a stacked integrated circuit package system 3500. Any suitable singulation process may be used, such as sawing or laser cutting to cut through the molding material 4502 to form a space 4802 to define the stacked integrated circuit package system 3500.

It has been discovered that semiconductor packages with top terminals can be manufactured using a simplified process flow by using frames with plated terminal leads and die attach pads.

Thus, it has been discovered that the integrated circuit package system of the present invention furnishes important and heretofore unknown and unavailable solutions, capabilities, and functional aspects for stacked integrated circuit packages.

Figure 49:
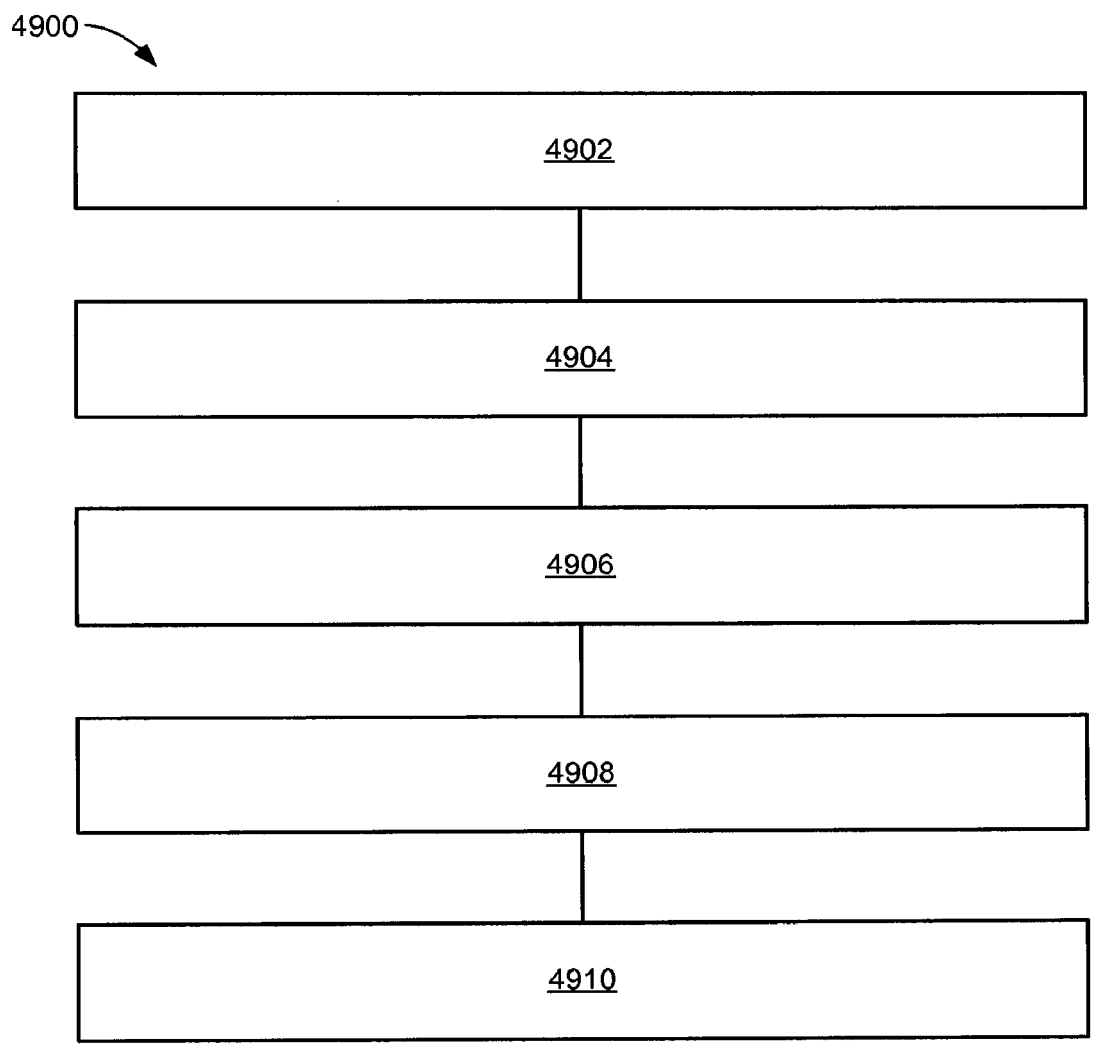
FIG. 49 is a flow chart of a method of manufacture of an integrated circuit package system in an embodiment of the present invention.

Referring now to FIG. 49, therein is shown a flow chart of a method 4900 of manufacture of an integrated circuit package system in an embodiment of the present invention. The method 4900 includes: attaching a first die to a first die pad in a block 4902; connecting electrically a second die to the first die through a die interconnect positioned between the first die and the second die in a block 4904; connecting a first lead adjacent the first die pad to the first die in a block 4906; connecting a second lead to the second die, the second lead opposing the first lead and adjacent the second die in a block 4908; and providing a molding material around the first die, the second die, the die interconnect, the first lead and the second lead, with a portion of the first lead exposed in a block 4910.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit package systems that are fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or

What is claimed:

1. A method of making a semiconductor device, comprising:
   providing a first semiconductor die;
   forming a first interconnect structure over a first surface of the first semiconductor die and extending beyond a footprint of the first semiconductor die;
   forming a plurality of bumps over an active surface of the first semiconductor die opposite the first surface of the first semiconductor die;
   providing a second semiconductor die;
   forming a second interconnect structure over a first surface of the second semiconductor die and extending beyond a footprint of the second semiconductor die;
   disposing the first semiconductor die, bumps, and first interconnect structure over an active surface of the second semiconductor die opposite the first surface of the second semiconductor die and second interconnect structure with the active surface of the first semiconductor die oriented toward the active surface of the second semiconductor die; and
   depositing an encapsulant around the second semiconductor die with the encapsulant contacting a sidewall of the second semiconductor die and a surface of the second interconnect structure.

2. The method of claim 1, further including depositing the encapsulant around the first semiconductor die.

3. The method of claim 1, further including depositing the encapsulant between the first and second semiconductor die.

4. The method of claim 1, further including forming a plurality of third interconnect structures over the second interconnect structure opposite the second semiconductor die.

5. The method of claim 1, further including disposing the first semiconductor die over a substrate.

6. The method of claim 5, further including
   removing the substrate after disposing the first semiconductor die, bumps, and first interconnect structure over the second semiconductor die.

7. A method of making a semiconductor device, comprising:
   providing a first semiconductor die;
   forming a first interconnect structure extending beyond a footprint of the first semiconductor die;
   forming a plurality of first bumps over the first semiconductor die;
   providing a second semiconductor die;
   forming a second interconnect structure over a first surface of the second semiconductor die and extending beyond a footprint of the second semiconductor die;
   disposing the first semiconductor die, first bumps, and first interconnect structure over an active surface of the second semiconductor die opposite the first surface of the second semiconductor die and second interconnect structure, wherein an active surface of the first semiconductor die is oriented toward the active surface of the second semiconductor die; and
   depositing an encapsulant around the second semiconductor die and extending to the second interconnect structure.

8. The method of claim 7, further including forming a plurality of second bumps over the second semiconductor die opposite the first semiconductor die.

9. The method of claim 7, further including forming the second interconnect structure extending beyond a footprint of the second semiconductor die.

10. The method of claim 7, further including disposing the first semiconductor die over a substrate.

11. The method of claim 7, wherein the encapsulant extends over the footprint of the first semiconductor die.

12. The method of claim 10, further including removing the substrate after depositing the encapsulant.

13. A semiconductor device, comprising:
    a first semiconductor die;
    a second semiconductor die disposed over the first semiconductor die with an active surface of the second semiconductor die oriented toward an active surface of the first semiconductor die;
    a first interconnect structure formed over a surface of the second semiconductor die;
    a plurality of first bumps formed between the first and second semiconductor die;
    an encapsulant deposited around first semiconductor die; and
    a second interconnect structure formed over the first semiconductor die and a surface of the encapsulant opposite the second semiconductor die.

14. The semiconductor device of claim 13, wherein the first interconnect structure is electrically connected to the second interconnect structure.

15. The semiconductor device of claim 13, wherein the first interconnect structure extends beyond a footprint of the second semiconductor die.

16. The semiconductor device of claim 13, wherein the second interconnect structure includes a second bump.

17. A semiconductor device, comprising:
    a first semiconductor die;
    a first interconnect structure formed over the first semiconductor die;
    a plurality of bumps formed over an active surface of the first semiconductor die;
    a second semiconductor die disposed over the bumps, wherein an active surface of the second semiconductor die is oriented toward the active surface of the first semiconductor die;
    an encapsulant deposited around the first semiconductor die; and
    a second interconnect structure formed over the encapsulant opposite the first semiconductor die.

18. The semiconductor device of claim 17, wherein the encapsulant is formed around the bumps and extends between the first and second semiconductor die.

19. The semiconductor device of claim 18, wherein the second interconnect structure extends beyond a footprint of the second semiconductor die.

20. The semiconductor device of claim 19, wherein the first interconnect structure extends beyond a footprint of the first semiconductor die.

21. The semiconductor device of claim 17, further including a substrate disposed over the second semiconductor die.

* * * * *